United States Patent
Furukawa

(10) Patent No.: US 7,302,666 B2
(45) Date of Patent: Nov. 27, 2007

(54) LOGIC CIRCUIT DESIGN METHOD, COMPUTER-READABLE RECORDING MEDIUM HAVING LOGIC CIRCUIT DESIGN PROGRAM STORED THEREIN, AND LOGIC CIRCUIT DESIGN DEVICE

(75) Inventor: Eiji Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 249 days.

(21) Appl. No.: 11/165,344

(22) Filed: Jun. 24, 2005

(65) Prior Publication Data

US 2006/0236281 A1    Oct. 19, 2006

(30) Foreign Application Priority Data

Mar. 17, 2005   (JP) ............................. 2005-078009

(51) Int. Cl.
*G06F 17/50* (2006.01)
(52) U.S. Cl. ............................ 716/13; 716/10; 716/11; 716/12; 716/14; 716/15; 716/16
(58) Field of Classification Search ............ 716/12–16
See application file for complete search history.

(56) References Cited

U.S. PATENT DOCUMENTS 5,889,677 A * 3/1999 Yasuda et al. ................. 716/6
6,035,106 A * 3/2000 Carruthers et al. ............ 703/1
7,073,149 B2 * 7/2006 Knol et al. ................... 716/11
7,158,924 B2 * 1/2007 Williams et al. .............. 703/17

FOREIGN PATENT DOCUMENTS

| JP | 3-27474 | 2/1991 |
|----|---------|--------|
| JP | 2003-256490 | 9/2003 |

* cited by examiner

*Primary Examiner*—Jack Chiang
*Assistant Examiner*—Naum Levin
(74) *Attorney, Agent, or Firm*—Westerman, Hattori, Daniels & Adrian, LLP.

(57) ABSTRACT

A logic circuit design method for use in a logic circuit having a hierarchical structure including an instance, a first block, and a second block is disclosed. The logic circuit design method includes the steps of reading information about the logic circuit, moving an instance which has a signal connection and a first hierarchical port connected thereto from a first block to a second block in accordance with the read information, creating a second hierarchical port in accordance with the movement of the instance, and disconnecting the instance from the first hierarchical port and connecting the instance to the second hierarchical port while maintaining the signal connection to the instance that the instance had at the time when the instance was moved from the first block to the second block.

18 Claims, 26 Drawing Sheets

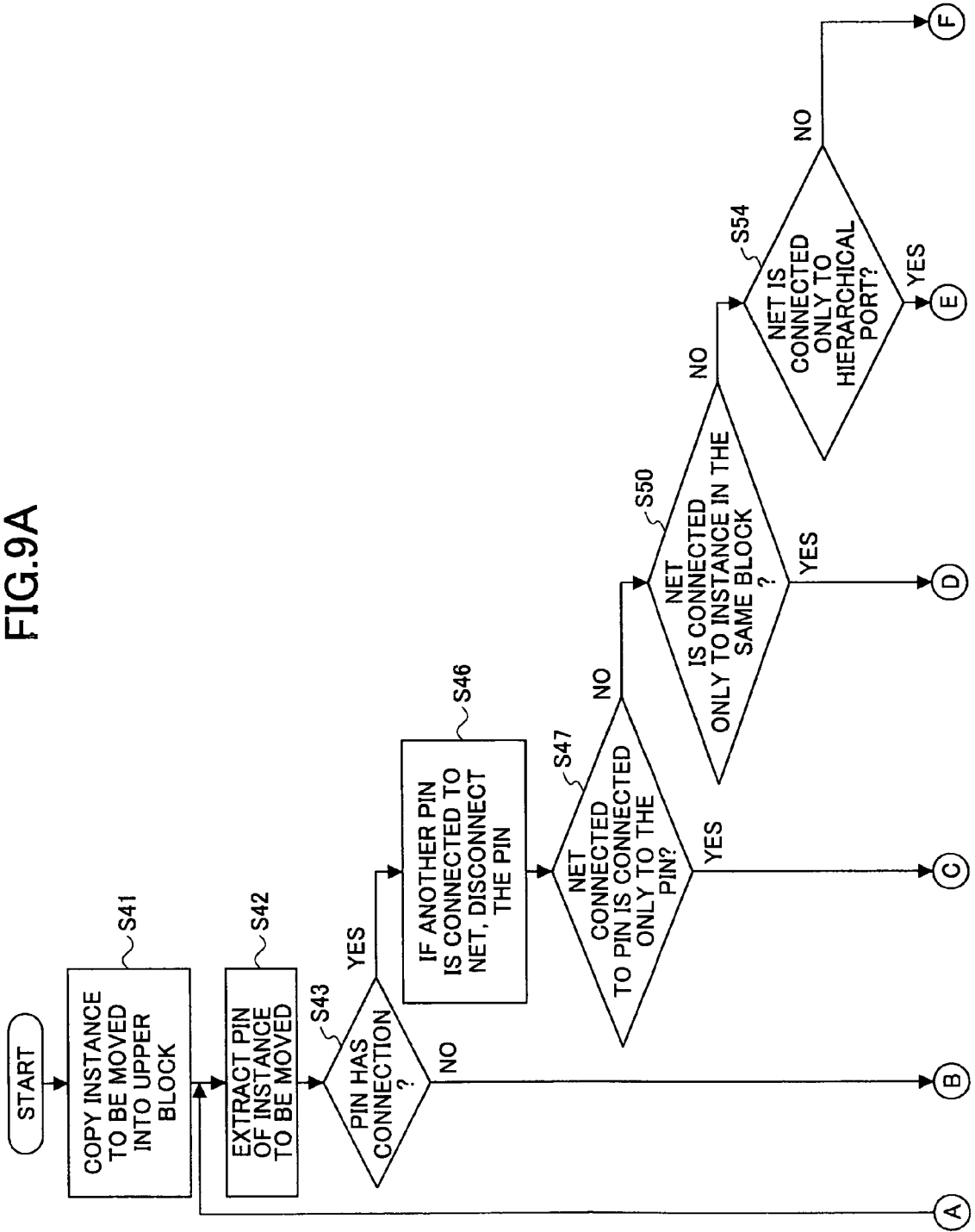

```
module A(p1, p2, p3, p4);
input p1;
input p2;
output p3;
output p4;
wire p5;
wire p6;
wire p7;
B1 X1(.p1(p1), .p2(p2), .p3(p5), .p4(p6));
B2 X2(.p4(p5), .p5(1'b0), .p6(p7), .p7(p3), .p8(p4));
INV X3(.A(p6), .YB(p7));
endmodule
```
(1)

```
module B1(p1, p2, p3, p4);
input p1;
input p2;
output p3;
output p4;
INV X1(.A(p1), .YB(p3));
INV X2(.A(p2), .YB(p4));
endmodule
```
(2)

```
module B2(p4, p5, p6, p7, p8);
input p4;
input p5;
input p6;
output p7;
output p8;
wire p1;
wire p2;
wire p3;
NAND3 X1(.A(1'b1), .B(p1), .C(p4), .YB(p2));
NOR3 X2(.A(p2), .B(p5), .C(p6), .YB(p3));
INV X3(.A(p3), .YB(p7));
INV X4(.A(p6), .YB(p8));
endmodule
```
(3)

FIG.27

```
module INV (A, YB);
  input  A ;
  output YB ;
endmodule module NAND3 (A, B, C, YB);
  input  A ;
  input  B ;
  input  C ;
  output YB ;
endmodule module NOR3 (A, B, C, YB);
  input  A ;
  input  B ;
  input  C ;
  output YB ;
endmodule
```
(1), (2), (3)

FIG.28

```
O: /X2/X1;
V: move;
C: /X1;

O: /X2/X2;
V: move;
C: /X1;
```
(1), (2)

FIG.29

```
module A(p1, p2, p3, p4);
input p1;
input p2;
output p3;
output p4;
wire p6;
wire p7;
wire p3_1;
B1 X1(.p1(p1), .p2(p2), .p4(p6), .p7(p7), .p3_1(p3_1));
B2 X2(.p6(p7), .p7(p3), .p8(p4), .p3(p3_1));
INV X3(.A(p6), .YB(p7));
endmodule
```
(1)

```
module B1(p1, p2, p4, p7, p3_1);
input p1;
input p2;
output p4;
input p7;
output p3_1;
wire p1_1;
wire p5;
wire p2_1;
INV X1(.A(p1), .YB(p5));
INV X2(.A(p2), .YB(p4));
NAND3 X1_1(.A(1'b1), .B(p1_1), .C(p5), .YB(p2_1));
NOR3 X2_1(.A(p2_1), .B(1'b0), .C(p7), .YB(p3_1));
endmodule
```
(2)

```
module B2(p6, p7, p8, p3);
input p6;
output p7;
output p8;
input p3;
INV X3(.A(p3), .YB(p7));
INV X4(.A(p6), .YB(p8));
endmodule
```
(3)

FIG.30

LOGIC CIRCUIT DESIGN METHOD, COMPUTER-READABLE RECORDING MEDIUM HAVING LOGIC CIRCUIT DESIGN PROGRAM STORED THEREIN, AND LOGIC CIRCUIT DESIGN DEVICE

BACKGROUND OF THE INVENTION

1. Field of the Invention

The present invention relates to a logic circuit design method, a computer-readable recording medium having a logic circuit design program stored therein, and a logic circuit design device, and particularly relates to a logic circuit design method, a computer-readable recording medium having a logic circuit design program stored therein, and a logic circuit design device that are applicable in logic circuit design using a hierarchical structure.

2. Description of the Related Art

As LSI circuits have become larger and larger in recent years, the use of design techniques such as so-called hierarchical division and tiling have become mainstream in physical design or layout design (i.e. operations for determining arrangement of cells and wiring between cells) of LSI circuits. It is therefore preferable in logical design, which is a preliminary process of physical design, to design a logical hierarchy corresponding to a physical hierarchy in view of convenience.

However, in some cases, logical design is made different from physical design because of CAD tool operability or designers convenience. For example, if a test circuit is inserted in a logic circuit in a DFT (Design For Test), a logical block to which the test circuit is inserted becomes different from a physical block (the term "block" used herein represents a level of hierarchy). Also, when designers input or verify logic circuits, they sometimes divide a hierarchy on a function basis for convenience reasons. In these cases, a hierarchy reconstruction operation is required after design operations so as to match a logical hierarchy to a physical hierarchy. Japanese Patent Laid-Open Publication No. 3-27474 (Reference 1) and Japanese Patent Laid-Open Publication No. 2003-256490 (Reference 2) disclose arts related to hierarchy reconstruction.

Reference 1 discloses a hierarchy reconstruction technique, in particular, a function that enables hierarchy reconstruction by moving instances between adjacent blocks, e.g., moving an instance X1 from a block B1 to an adjacent block B2 (see FIG. 1). However, it does not disclose a function for moving instances in other manners different from the manner described above with reference to FIG. 1 or a function for deleting hierarchical ports that have become unnecessary during a reconstruction operation.

Reference 2 also discloses a hierarchy reconstruction technique. This technique is applicable when two pins or ports are connected to a net, but it seems to be not applicable when three or more pins or ports are connected to a net.

Neither of these related arts discloses a function for assigning directions to newly created hierarchical ports, a method for processing a constant (if any) assigned to a pin of an instance to be moved or to a hierarchical port to be connected to the pin, and a technique for processing multiple instances that refer to the same module.

Because existing CAD tools only have limited functions for hierarchy reconstruction as described above, designers need to manually reconstruct hierarchy or perform complicated operations for hierarchy reconstruction using the existing CAD tools.

SUMMARY OF THE INVENTION

A general object of the present invention is to provide a logic circuit design method, a computer-readable recording medium having a logic circuit design program stored therein, and a logic circuit design device. A specific object of the present invention is to provide a logic circuit design method, a computer-readable recording medium having a logic circuit design program stored therein, and a logic circuit design device that allow automatic hierarchy reconstruction with use of CAD tools or the like, thereby reducing TAT (Turn Around Time), preventing errors due to manual corrections, and improving design quality and convenience.

According to an aspect of the present invention, there is provided a logic circuit design method for use in a logic circuit having a hierarchical structure including an instance, a first block, and a second block, the method comprising the steps of reading information about the logic circuit, moving an instance which has a signal connection and a first hierarchical port connected thereto from a first block to a second block in accordance with the read information, creating a second hierarchical port in accordance with the movement of the instance, and disconnecting the instance from the first hierarchical port and connecting the instance to the second hierarchical port while maintaining the signal connection to the instance that the instance had at the time when the instance was moved from the first block to the second block.

With this method, operations required when moving an instance across blocks can be easily and surely performed with a simple configuration.

Accordingly, the present invention allows automatic hierarchy reconstruction for a circuit having a hierarchical structure in logical deign, thereby improving convenience in design, reducing TAT, and improving quality of circuit design.

BRIEF DESCRIPTION OF THE DRAWINGS

FIG. 9A is a flowchart illustrating processing for moving an instance to a block one level above;

FIG. 27 is an example of a description of logic circuit design data in HDL (gate level) before correction (reconstruction);

FIG. 28 is an example of a library description for a logic circuit of FIG. 27;

FIG. 29 is an example of a description of an instruction file for moving instances from block to block; and FIG. 30 is an example of a description of logic circuit design data in HDL after correction (reconstruction).

DETAILED DESCRIPTION OF THE PREFERRED EMBODIMENT

Specific examples of logical hierarchy reconstruction processing performed by a logical hierarchy reconstruction method according to the present invention are given below with reference to FIGS. 1-4.

Figure 1:
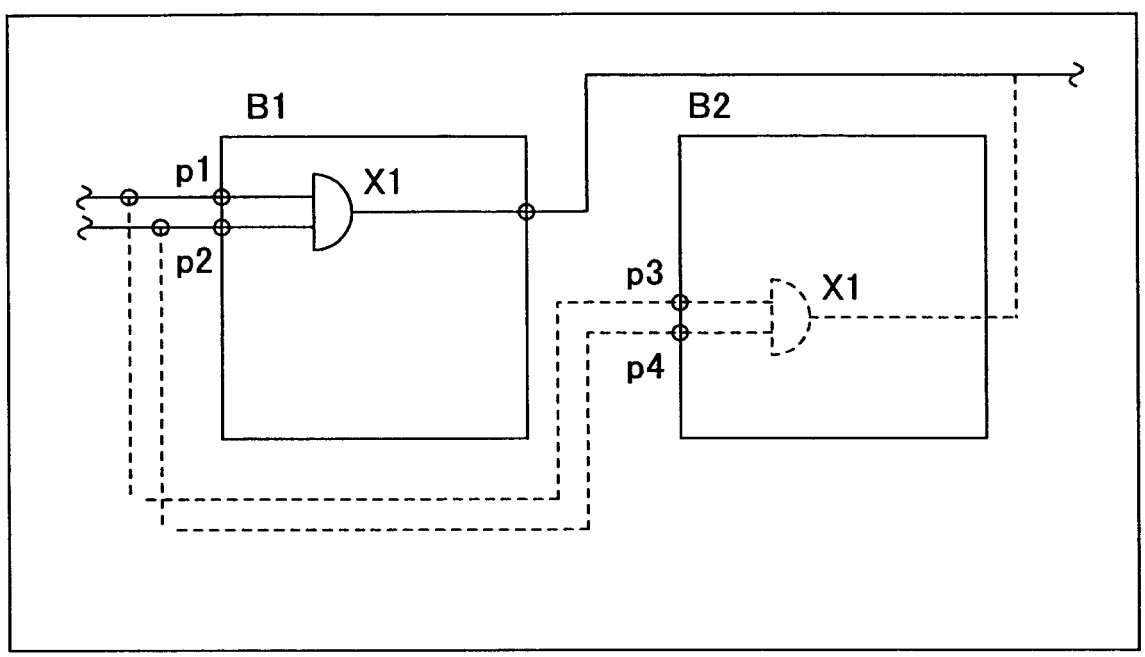
FIG. 1 is a schematic diagram illustrating an example of hierarchy reconstruction processing according to the present invention.

FIG. 1 illustrates a part of logic circuit design data having a hierarchical structure. A logic circuit shown in FIG. 1 comprises a top block TOP, and blocks B1 and B2 one level below the block TOP. FIG. 1 shows processing for moving a cell X1 as a logic element from the block B1 to the block B2. In this case, when the cell X1 is moved from the block B1 to the block B2, hierarchical ports p1 and p2 become unnecessary and therefore need to be deleted from the source block B1. On the other hand, in the destination block B2, hierarchical ports p3 and p4 need to be newly created.

Figure 2A:
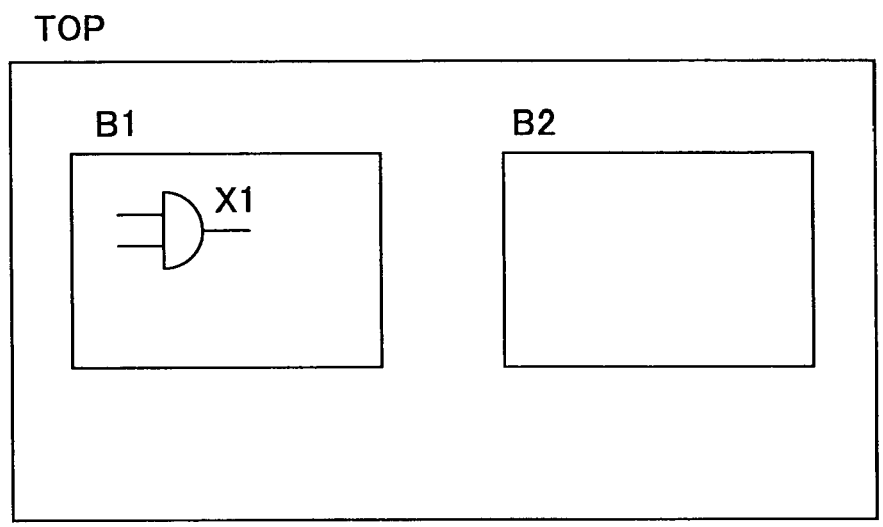
FIGS. 2A-2C are schematic diagrams illustrating another example of hierarchy reconstruction processing according to the present invention.
Figure 2B:
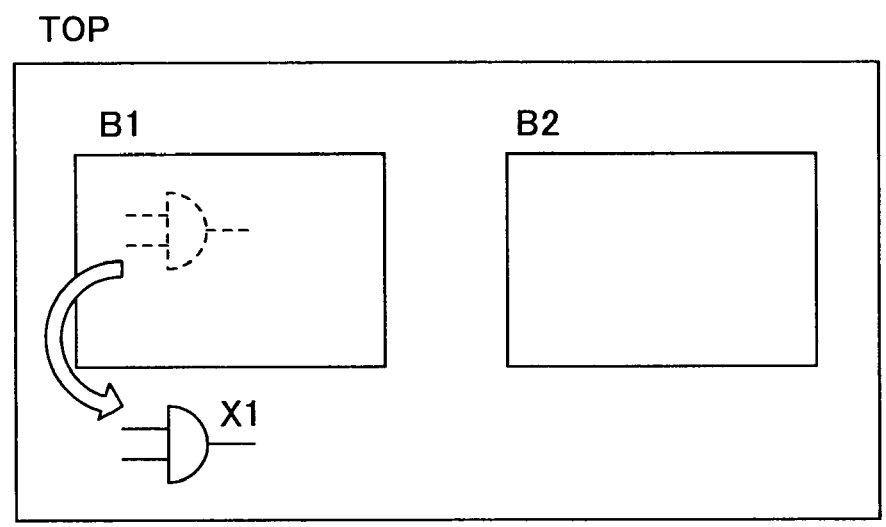
Figure 2C:
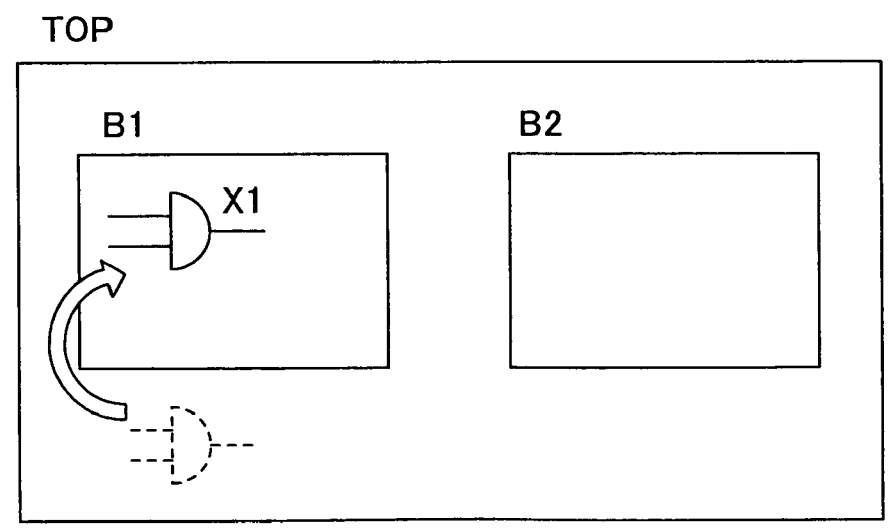

FIGS. 2A-2C illustrate an operations for moving a cell X1 from a block B1 to a block TOP one level above the block B1 (FIG. 2A→FIG. 2B), and the reverse operation (FIG. 2B→FIG. 2C).

Figure 3:
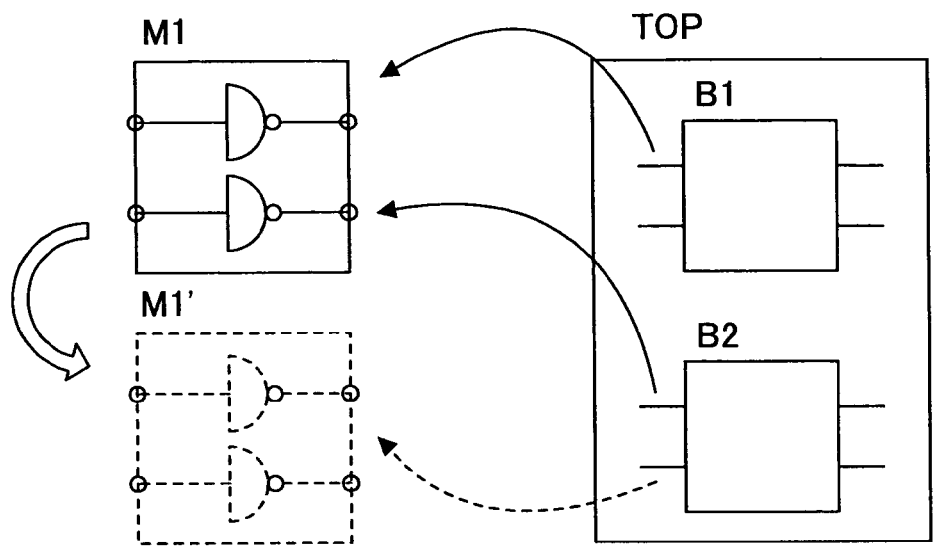
FIG. 3 is a schematic diagram illustrating another example of hierarchy reconstruction processing according to the present invention.

FIG. 3 illustrates so-called "multi-instance processing". In FIG. 3, a block B1 and a block B2 are configured to refer to the same module M1. When only instances in the block B1 need to be moved to another block, the configuration of the module M1 needs to be modified. However, if the configuration of the module M1 is modified, the configuration of the block B2, which refers to the module M1, is also modified even when not wanted. This is inconvenient in logical hierarchy reconstruction. To prevent such an inconvenience, according to the present invention, a module M1' as a copy of the module M1 is created. Thus, the block B1 and the block B2 can be configured to refer to the module M1 and the module M1', respectively, so that the block B1 and the block B2 can be modified independently of each other. This processing is referred to as "multi-instance processing" hereinafter.

Figure 4:
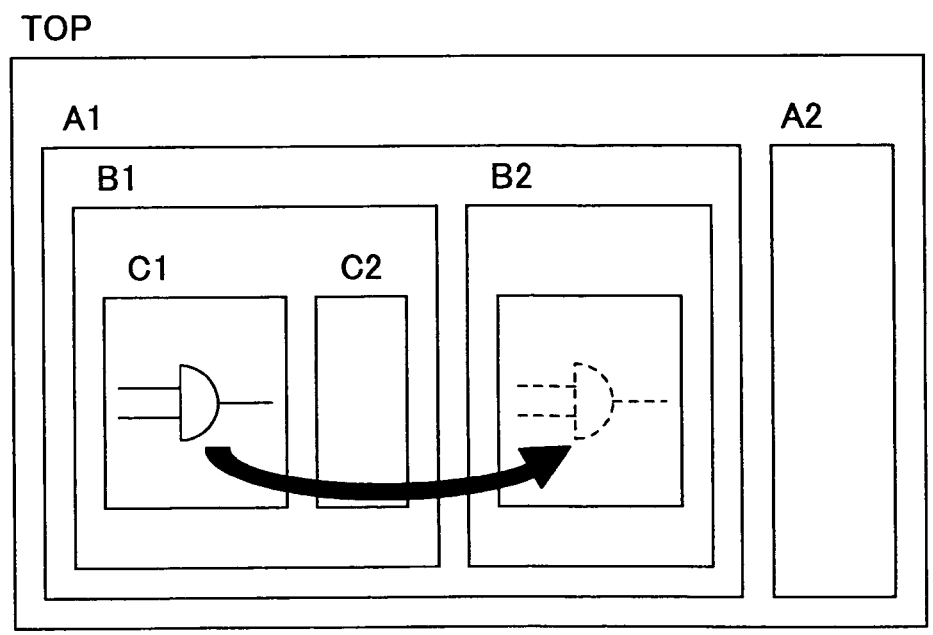
FIG. 4 is a schematic diagram illustrating another example of hierarchy reconstruction processing according to the present invention.

FIG. 4 illustrates an example of a complex hierarchical structure in logical design. As shown in FIG. 4, a top block TOP is provided. Then, blocks A1 and A2 are provided one level below the block TOP. Further, blocks B1 and B2 are provided one level below the block A1. Further, blocks C1 and C2 are provided one level below the block B1.

The following describes a logical hierarchy reconstruction system 100 serving as a logic circuit design device for implementing a logic circuit design method according to an embodiment of the present invention with reference to the accompanying drawings.

Figure 5A:
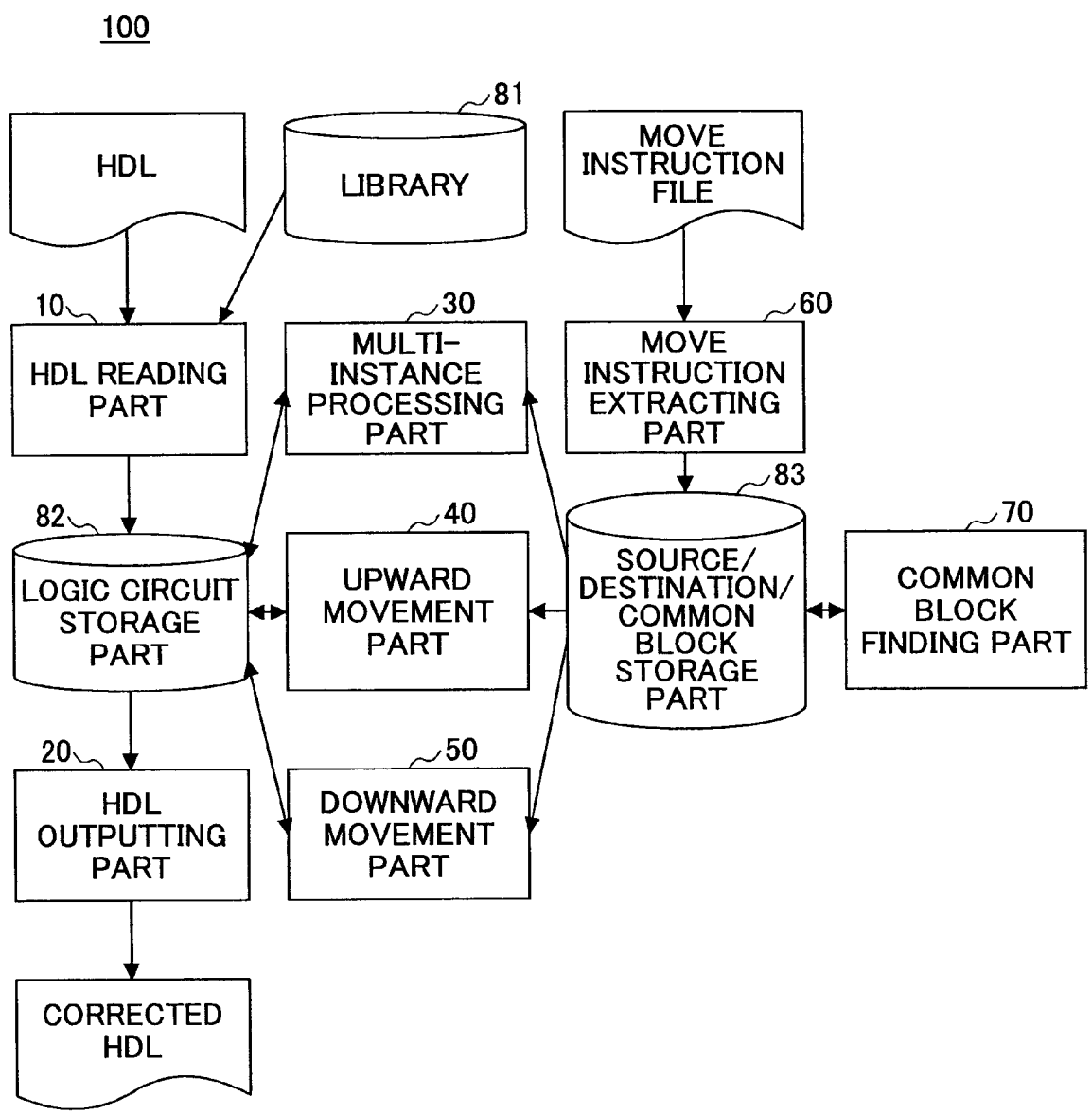
FIG. 5A is a functional block diagram illustrating an embodiment of the present invention.
Figure 5B:
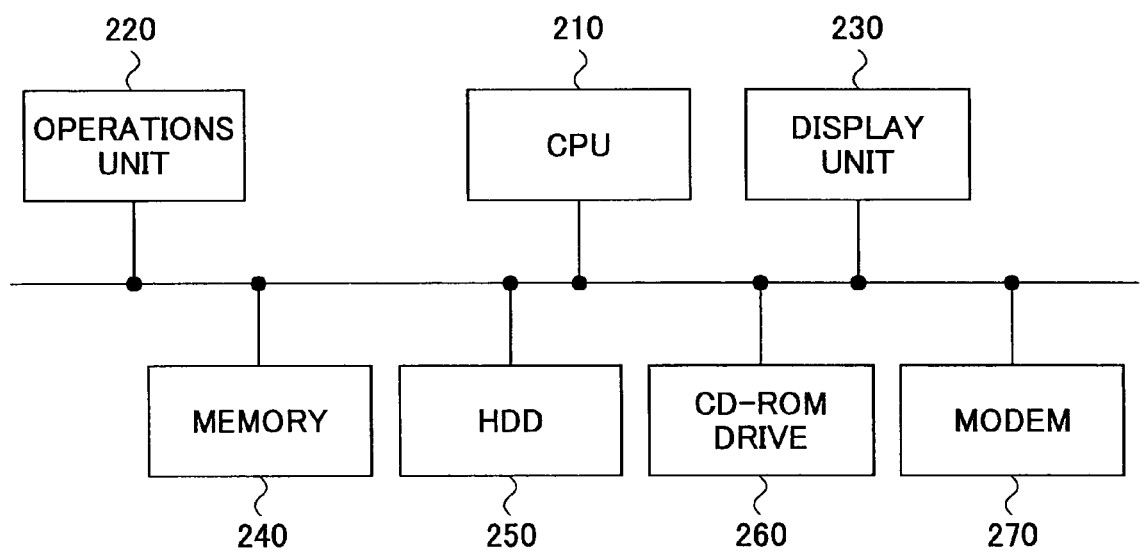
FIG. 5B is a block diagram illustrating a hardware configuration of an embodiment of the present invention.

FIG. 5A is a functional block diagram illustrating the logical hierarchy reconstruction system 100 according to an embodiment of the present invention. FIG. 5B is a block diagram illustrating a hardware configuration of the system 100.

As shown in FIG. 5A, the logical hierarchy reconstruction system 100 according to an embodiment of the present invention comprises an HDL reading part 10 for reading logic circuit design data written in HDL, a logic circuit storage part 82 for storing the read design data, and an HDL outputting part 20 for outputting design data written in HDL generated as a result of logical hierarchy reconstruction processing performed in the logic circuit storage part 82.

The system 100 further comprises a library 81 for storing information about instances included in a logic circuit related to the design data in a referable manner, a move instruction extracting part 60 for extracting instruction information about instance movement (for example, information about sources and destinations) from an instruction information file including instruction information about instance movement, a common block finding part 70 for finding a common block including both a source block and a destination block, and a source/destination/common block storage part 83 for storing information acquired by the move instruction extracting part 60 and the common block finding part 70.

For instance, in the example shown in FIG. 1, when the instance X1 is moved from the block B1 to the block B2, the blocks B1 and B2 are independent from one another and are not common blocks. With reference to FIG. 2B, the cell X1 is moved to the block TOP one level above, and then the cell X1 is moved from the block TOP to the destination block B2 one level below.

The system 100 further comprises a multi-instance processing part 30 for performing the "multi-instance processing" according to the information about the move instruction and information about the common block, an upward movement part 40 for moving an instance to a block one level above (e.g. FIG. 2A→2B), and a downward movement part 50 for moving an instance to a block one level below (FIG. 2B→2C).

The system 100 of FIG. 5A can be realized by a computer 200 as shown in FIG. 5B. The computer 200 comprises a CPU 210, an operations unit 220 including a key board and a mouse to allow designers to input instruction information and data, a display unit 230 including a CRT to allow the designers to view processing results, a memory 240 including a ROM and a RAM to be used as a work area by the CPU 210, a CD-ROM drive 260 for reading information from CD-ROMs as portable recording media, a modem 270 to allow communication with servers via a communication network such as Internet and LAN, and a bus for interconnecting these components to allow communication among them.

The HDL reading part 10, the HDL outputting part 20, the multi-instance processing part 30, the upward movement part 40, the downward movement part 50, the move instruction extracting part 60, and the common block finding part 70 shown in FIG. 5A can be implemented as a software program including instructions for causing the CPU to execute operations corresponding to these parts. The program is stored in a CD-ROM in advance so as to be read by the CD-ROM drive 260 or is downloaded from the server via the communication network. The program is then stored in a hard disk, so that the CPU 210 can read and execute the program. Thus, the logical hierarchy reconstruction system 100 according to an embodiment of the present invention can be realized.

Figure 6:
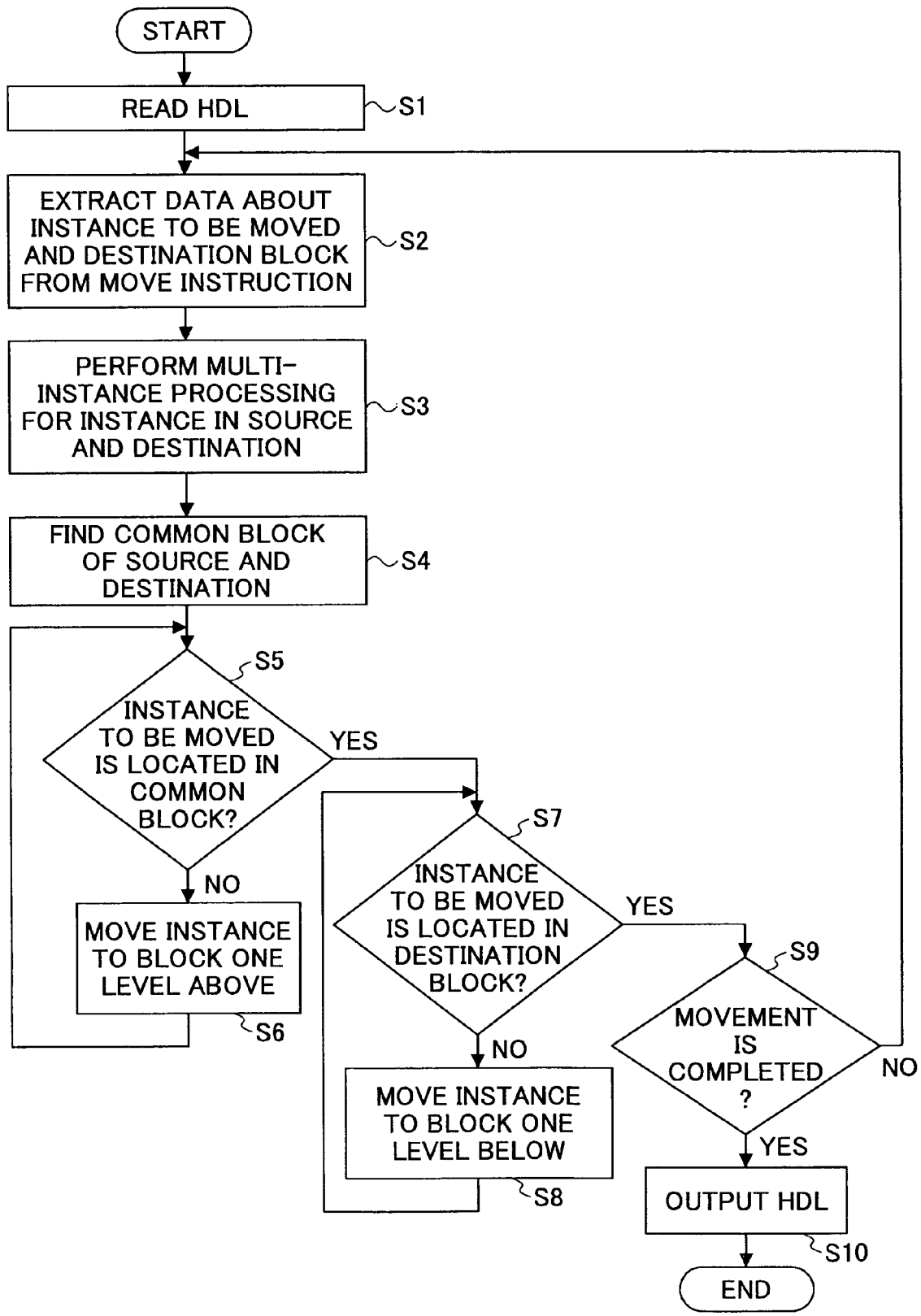
FIG. 6 is a flowchart illustrating hierarchy reconstruction processing according to the present invention.

FIG. 6 is a flowchart illustrating a main operational flow of the logical hierarchy reconstruction system 100 according to the above embodiment of the present invention.

The HDL reading part 10 reads the logic circuit design data written in HDL (Hardware Description Language) (step S1). The move instruction extracting part 60 reads and extracts an instruction(s) about an instance(s) to be moved and a destination block thereof (step S2). The multi-instance processing part 30 performs the multi-instance processing for instances in the source block and the destination block (step S3).

The common block finding part 70 finds a common block including both the source block and the destination block (step S4). It is determined whether the instance to be moved is located in the common block (step S5). For example, when the cell X1 is located in the block B1 as shown in FIG. 2A, it is determined to not be located in a common block including both the source block B1 and the destination block B2. If the cell X1 is moved to the block TOP, which includes both the source block B1 and the destination block B2, as shown in FIG. 2B, it is determined to be located in a common block.

If the instance to be moved is not located in the common block as shown in FIG. 2A (if No in step S5), the instance is moved to a block one level above as shown in FIG. 2B (step S6).

If the instance is thus moved to the common block (if Yes in step S5), it is then determined whether the instance is further moved to the destination block. For example, the instance X1 shown in FIG. 2B is not yet moved to the destination block B2. In such a case, "processing for moving an instance to a block one level below" is performed (step S8). For example, the instance X1 shown in FIG. 2B is moved to the block B2 one level below.

If moving operations are ended through such processing (if Yes in step S9), logic circuit design data including the movement result is output as an HDL description (step S10).

In step S1, information about cells to which the logic circuit design data written in HDL refers is also read from the library 81. In step S2, if there are two or more instances to be moved or if there are two or more instructions about an instance to be moved, processing in steps S3-S8 is repeated for each instance or each instruction.

In step S4, if there is no common block, the highest block is set as a common block as in the example shown in FIGS. 2A-2C. In step S6, if the common block is two or more levels above the source block, processing for moving the instance to a block one level above is repeated for the number of times corresponding to the differences of the level. Also, if there is a hierarchical port that has become unnecessary (e.g. ports p1 and p2 in FIG. 1), the port is deleted. In step S8, if the destination block is two or more levels below the common block, processing for moving the instance to a block one level below is repeated for the number of times corresponding to the different levels. Also, if a new hierarchical port needs to be created (e.g. ports p3 and p4 in FIG. 1), the port is created. Then, a direction is determined and assigned to the newly created port.

In steps S6 and S8, if a constant is assigned to a pin of the instance to be moved or to a port connected to the pin, the same constant is assigned to a pin of the instance after the movement. The phrase "constant is assigned" used herein means that the value, such as "0" or "1", for an element (pin, etc.) is already fixed. Attributes other than constants that define a state of a pin or a port other than pin-to-pin, port-to-port, pin-to-port connections may be applicable.

The processing described with reference to FIG. 6 allows moving an instance from a block to another block while maintaining a signal connection thereof. For example, in the example shown in FIG. 1, the instance X1 can be moved from a block to another block without disconnecting wires (also referred to as "net") connected to the instance X1. In the processing of FIG. 6, a direction can be automatically assigned to a newly created hierarchical port. Furthermore, even when a constant is assigned, the constant can be moved without being logically changed. As a result, TAT and errors due to manual corrections can be reduced, so the design quality and convenience are improved.

Figure 22:
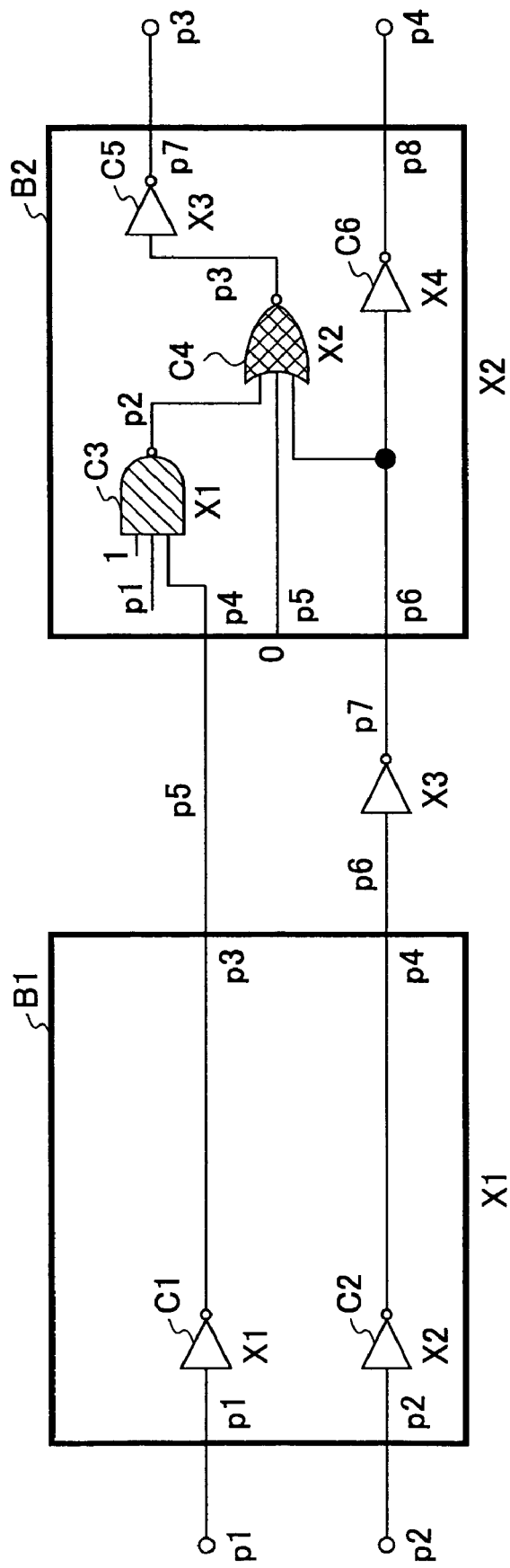
FIGS. 22-26 are schematic diagrams that illustrate an example of transition during processing for moving predetermined instances from block to block on actual logic circuit design data.

FIG. 27 is an example of an HDL description of the logic circuit design data of FIG. 22. FIG. 28 illustrates an example of an HDL description of a library for cells included in a logic circuit.

The library is configured to store the name and direction of pins of each cell. For example, referring to FIG. 28, a section indicated by (1) describes about a module of an inverter cell. This section indicates that the inverter cell includes an input port A and an output port YB. Referring then to FIG. 27, line 11 in a section indicated by (1) describes about an inverter cell X3 connecting between a block B1 and a block B2 of FIG. 22

This line indicates that a wire p6 is connected to an input port A of the inverter cell X3 while a wire p7 is connected to an output port YB of the inverter cell X3. That is, by acquiring the direction of the inverter cell X3 from the HDL description of the library of FIG. 27, it can be recognized that the wire p6 is connected to the input port of the inverter cell X3 while the wire p7 is connected to the output port of the inverter cell X3 as shown in FIG. 22.

Line 1 in the section (1) in FIG. 27 shows ports p1, p2, p3, and p4 for a block TOP, which is one level above the blocks B1 and B2 of FIG. 22. Line 2 through line 8 show the breakdown of line 1, indicating that the ports p1 and p2 are input ports while the ports p3 and p4 are output ports (i.e. directions), and that wires p5, p6, and p7 are included in the block TOP.

Line 9 describes about the block B1, indicating that the hierarchical ports p1, p2, p3 and p4 of the block B1 are connected to wires p1, p2, p5 and p6, respectively. Line 10 describes about the block B2, indicating the connection thereof in the same manner as described above.

In this way, when the HDL description of the logic circuit design data is read, the library 81 is referred so that the direction of each instance pin is acquired therefrom to be stored in the logic circuit storage part 82 (see FIG. 5A).

As shown in FIG. 29, the move instruction file that is given to the move instruction extracting part 60 of FIG. 5A is described in the following format.

O: source instance {, source instance . . . };
V: move;
C; destination block;
. . .

One or more source instances may be included in a single format. If two or more source instances are included, the instances are moved to the same destination block. A single file may contain one or more of the above formats. If a file contains two or more formats, source instances are moved to corresponding destination blocks.

The following is an example of a move instruction.
O: /X1/X2/X3;
V: move;
C: /X4/X5;

The source instance is described as a string including a source block and an instance to be moved connected through /. In the above example, /X1/X2/X3 represents an instance X3 below a block X2, which is below a block X1.

The destination block is described as a string including a destination block connected through /. In the above example, /X4/X5 represents a block X5 below a block X4.

Accordingly, the above example is an instruction for moving the instance /X1/X2/X3 to be /X4/X5/X3.

In the multi-instance processing, as described previously, if there is a first hierarchical instance referring to a module that is referred to by a second instance, a copy of the module is created so that the second hierarchical instance refers to the created (copied) module. For example, in the case where a source instance is /X1/X2/X3 and a destination block is /X4/X5, if there is an instance referring to a module that is referred to by a second instance in each of /X1,
/X1/X2,
/X4, and
/X4/X5 a copy of the module is created so that the second instance refers to the copied module.

Figure 7:
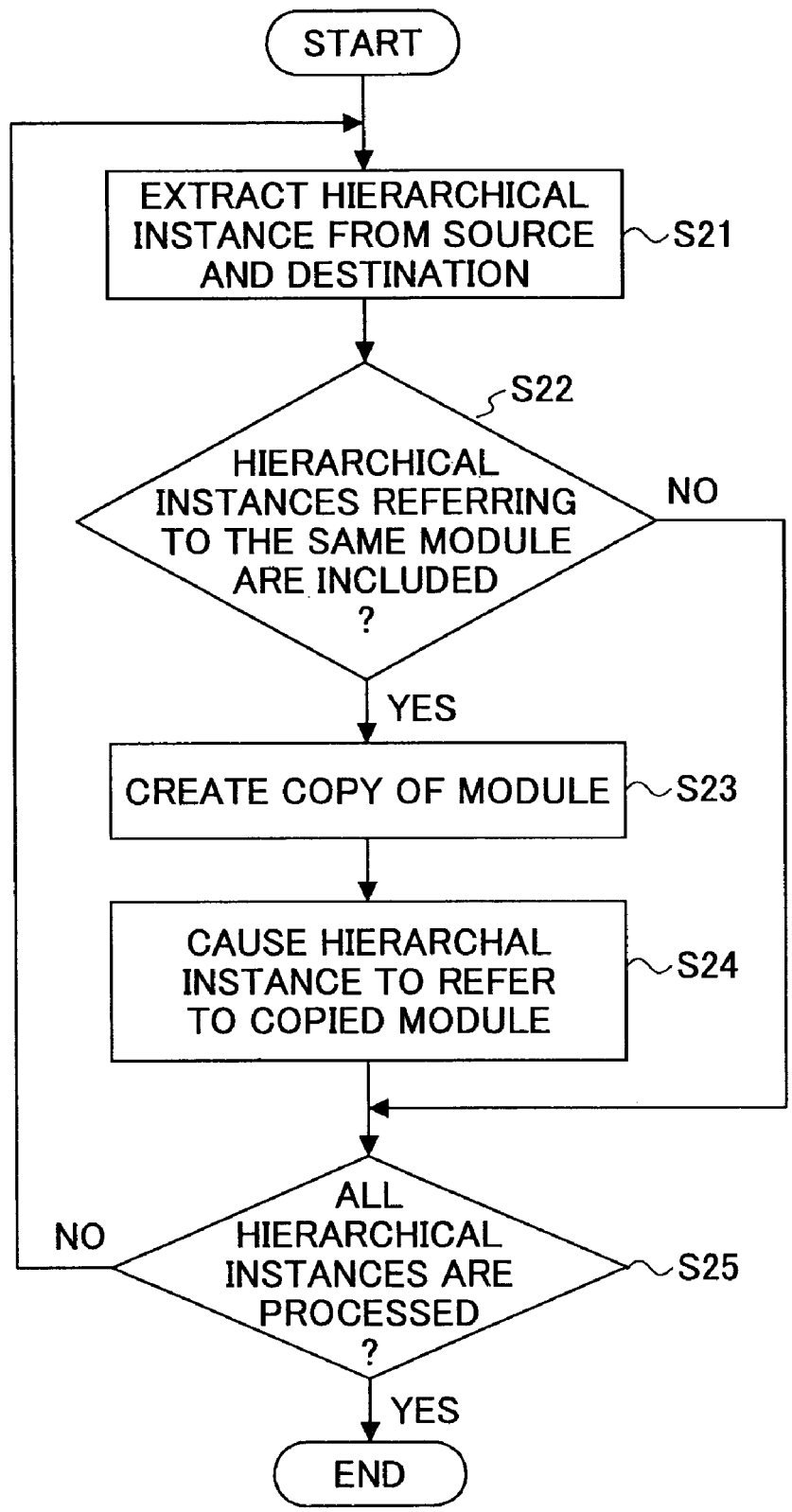
FIG. 7 is a flowchart illustrating "multi-instance processing"

FIG. 7 is a flowchart illustrating the multi-instance processing in step S3 of FIG. 6. In FIG. 7, hierarchical instances are extracted based on information about a source block and a destination block (step S21). In the above example, /X1, /X1/X2, /X4, and /X4/X5 are extracted.

It is determined whether hierarchical instances referring to the same module are included (step S22). If it is determined that hierarchical instances referring to the same module are included, a copy of the module is created (step S23) to cause one of the hierarchical instances to refer to the copied module (step S24). Thus, all the hierarchical instances are made to refer to different modules (Yes in step S25).

The term "common block" indicates a block that includes both a source block and a destination block and is the most distant block from a top block. For example, the common block of a block /X1/X2/X3/X4/X5 and a block /X1/X2/X4/X3/X5 is /X1/X2. If there is no block including both a source block and a destination block, the common block is set to a top block. The top block is represented by a symbol "/" hereinafter.

Figure 8:
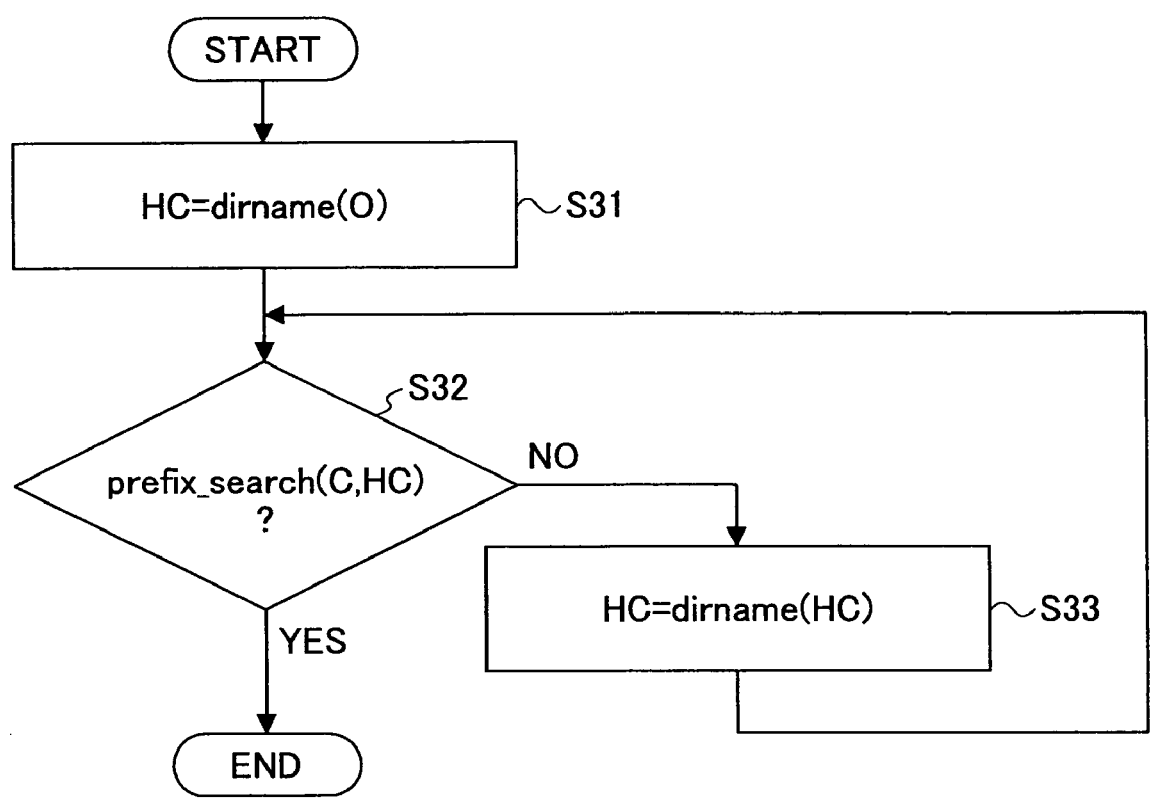
FIG. 8 is a flowchart illustrating processing for finding a common block.

FIG. 8 is a flowchart illustrating processing for finding a common block. In FIG. 8, "O" represents a source instance; "C" represents a destination block; and HC represents a common block. "dirname (x)" in step S31 is a function that finds a block one level above x. For example, if x is /X1/X2/X3, the function returns /X1/X2. If x is /X1, the function returns /.

"prefix_search (x, y)" in step S32 is a function that determines whether prefixes of x and y match. For example, if x is /X1/X2/X3 and y is /X2, the result is No (because the prefix X2 of y do not match the prefix X1 of x). On the other hand, if x is /X1/X2/X3 and y is /X1, the result is Yes (because the prefixes X1 match).

In the above example, if a destination block C is /X1/X2/X3/X4/X5 and a source instance O is X1/X2/X4/X3/X5, it is found that HC=/X1/X2/X4/X3 in step S31. Then, it is determined No in step S32, because HC=/X1/X2/X4/X3 do not match the prefix of C, i.e., /X1/X2/X3/X4.

When No in step S32, the processing proceeds to S33, in which a block one level above /X1/X2/X4/X3 is removed to obtain HC=/X1/X2/X4. Then, the processing returns to step S32, in which it is determined No again because the prefixes still does not match. The processing returns to step S33 again, in which HC=/X1/X2 is obtained. Then, the processing returns to step S32 again, in which it is finally determined Yes, because the prefixes /X1/X2 match. Thus, /X1/X2 is found as the common block.

Figure 9B:
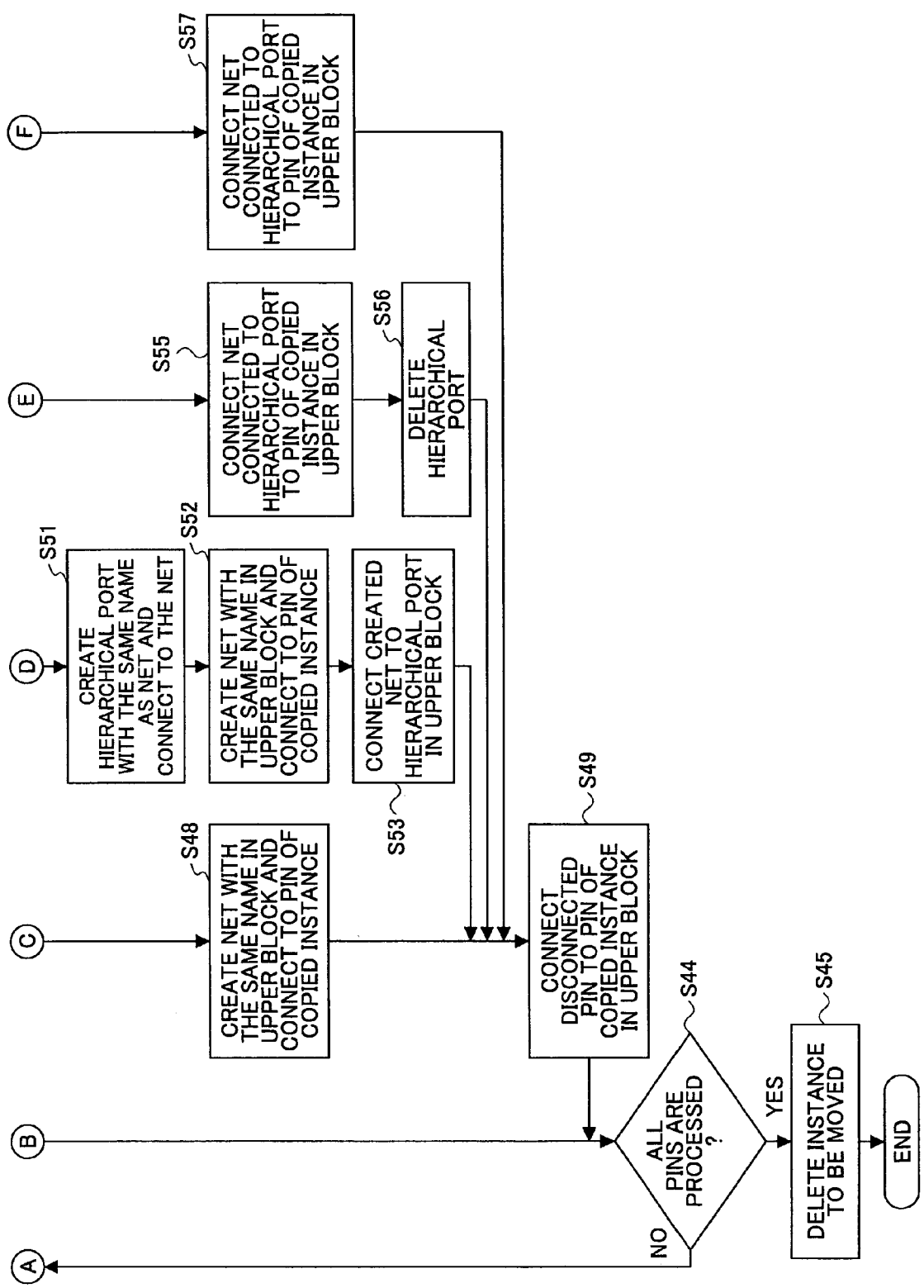
FIG. 9B (continued) is a flowchart illustrating processing for moving an instance to a block one level above.

A flowchart of the processing for moving an instance to a block one level above in step S6 of FIG. 6 is shown in FIGS. 9A and 9B. This processing includes creation of hierarchical ports and a net (wires) that are newly required due to the processing for moving an instance to a block one level above. A method that copies an instance into a destination block, and deletes the original instance in a source block at the end of the processing is used in the processing for moving an instance to a block one level above. The same method is used in the processing (to be described below with reference to FIGS. 10A and 10B) for moving an instance to a block one level below.

Referring to FIGS. 9A and 9B, a copy of an instance to be moved is created in a block one level above (step S41). In step S41, if the created instance has the same name as another instance, the name of the created instance is changed to a different name.

Then, a pin of the instance to be moved is extracted (step S42). If the pin does not have any connection (No in step S43), it is then determined whether all the pins of the instance are already processed (step S44). If Yes in step S44, the original instance to be moved is deleted (step S45). Thus, the processing to move an instance to a block one level above is completed.

Figure 21A:
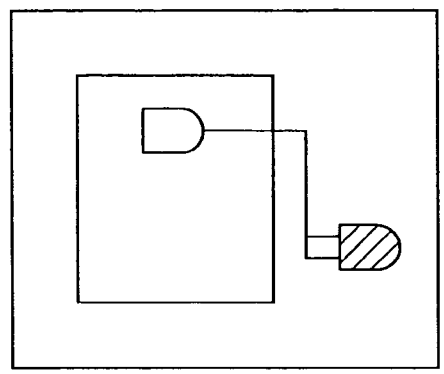
FIGS. 21A-21D are schematic diagrams illustrating an example of processing for moving an instance to a block one level below in the case where plural pins are connected to the same net.
Figure 21B:
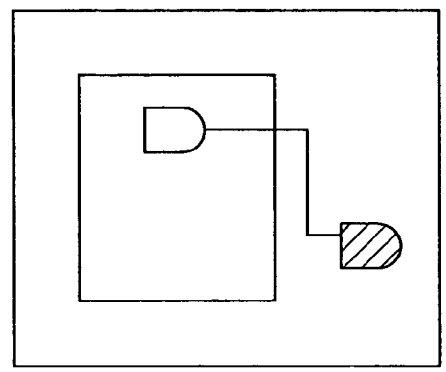

On the other hand, if the result of step S43 is Yes, the processing proceeds to step S46. In step S46, if a net connected to the pin of the instance being processed is also connected to another pin of the same instance, the latter pin is disconnected (FIG. 21A→21B). It is noted that, in step S43, if the pin of the instance does not have any connection and a constant is assigned to the pin of the instance, the same constant is assigned to a pin of the copied instance.

Then, it is determined whether the net connected to the pin is connected only to this pin (step S47). For example, in an example shown in FIG. 12A, it is determined Yes in step S47. If Yes in step S47, a net with the same name is created in a block one level above and then connected to the pin of the copied instance (step S48) (see FIG. 12B).

Figure 21C:
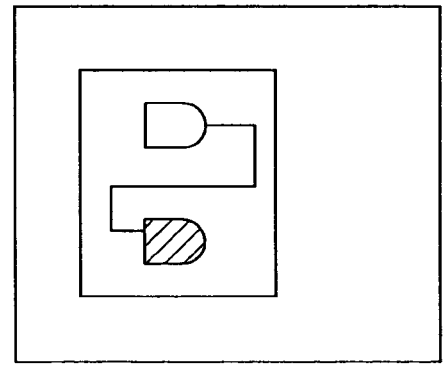
Figure 21D:
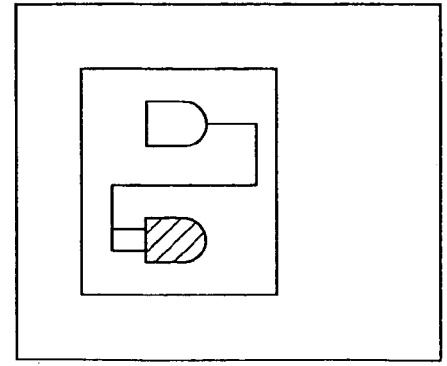

If there is a pin disconnected in step S46, a pin of the copied instance corresponding to the disconnected pin is reconnected to a pin of the copied instance being processed (step S49) (FIG. 21C→21D).

If No in step S47, it is then determined whether the net is connected only to an instance in the same block (step S50). For example, it is determined Yes in an example shown in FIG. 13A. This is because an instance (a cell with hatched lines) is connected only to another instance (a cell without hatched lines) in the same block (a block in the center in FIG. 13A).

Figure 13A:
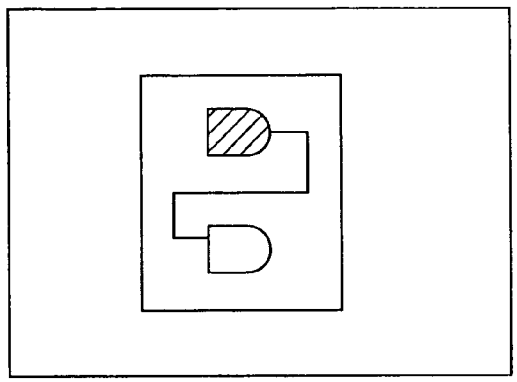
FIGS. 13A and 13B are schematic diagrams illustrating another example of processing for moving an instance to a block one level above.
Figure 13B:
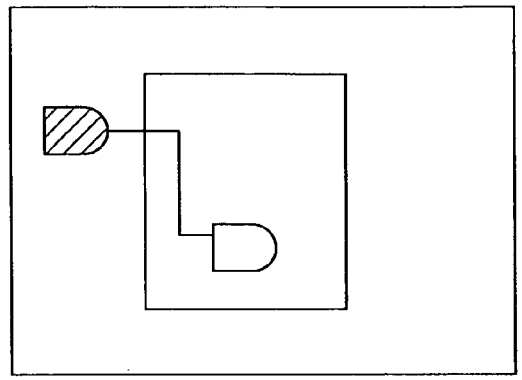

If the result is Yes in step S50, a hierarchical port having the same name as the net is created in the block and then connected to the net (step S51). Then, a net having the same name is created in a block one level above and then connected to the pin of the copied instance (step S52). The net created in the block one level above is connected to the hierarchical port (step S53) so as to be, for example, as shown in FIG. 13B. That is, the instance (without hatched line) is connected to the copied instance (with hatched line) through the newly created hierarchical port and the net.

If No in step S50, it is then determined whether the net is connected only to a hierarchical port of the block where the net is located (step S54). For example, it is determined Yes in an example shown in FIG. 14A. On the other hand, it is determined No in an example shown in FIG. 15A. This is because, in the example shown in FIG. 15A, a net connected to an instance (a cell with hatched lines) is connected not only to a hierarchical port (cross point of a net and a border between blocks) but also to another instance (a cell without hatched lines) in the same block.

Figure 14A:
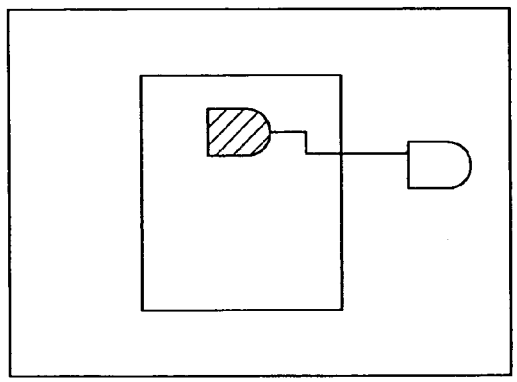
FIGS. 14A and 14B are schematic diagrams illustrating another example of processing for moving an instance to a block one level above.
Figure 14B:
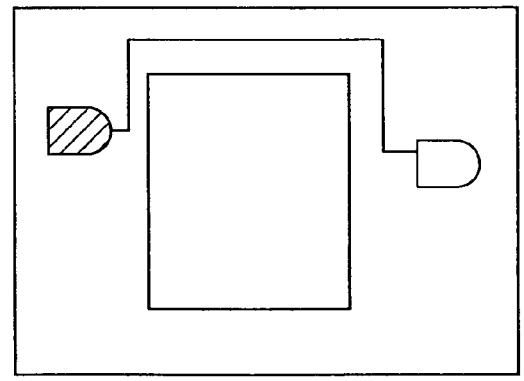

If Yes in step S54, in a block one level above, a net connected to the hierarchical port is connected to a pin of the copied instance (step S55). Then, the hierarchical port is deleted (step S56) so as to be, for example, as shown in FIG. 14B. That is, the net connected to another instance through the hierarchical port (as shown in FIG. 14A) is disconnected from such instance to be connected to a copied instance (with hatched line in FIG. 14B) newly created in the block one level above (outside the center block).

Figure 15A:
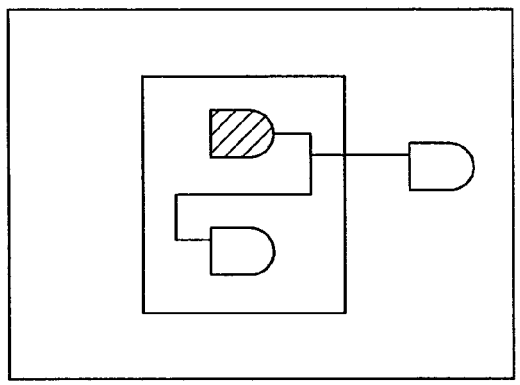
FIGS. 15A and 15B are schematic diagrams illustrating another example of processing for moving an instance to a block one level above.
Figure 15B:
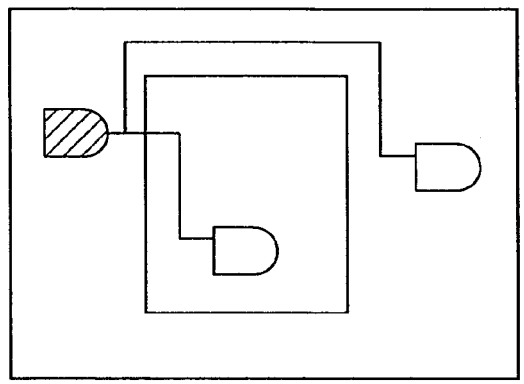

If No in step S54, in the block one level above, the net connected to the hierarchical port is connected to a pin of the copied instance (step S57) so as to be, for example, as shown in FIG. 15B.

In steps S48 and S52, if the created net has the same name as another net, the name of the created net is changed to a different name. In step S51, if the created hierarchical port has the same name as another hierarchical port, the name of the created hierarchical port is changed to a different name.

In step S55, if there is no net connected to the hierarchical port, the pin of the copied instance is connected nowhere.

In step S57, if there is no net connected to the hierarchical port, a net is newly created (with a net name different from other net names). Then, the newly created net, the hierarchical port, and the pin of the copied instance are connected. Thus, the copied instance can maintain the same connection as the connection through the hierarchical port that the instance to be moved had.

In step S51, a direction opposite to a direction of the instance pin being processed is assigned to the created hierarchical port. For example, the direction is assigned to the hierarchical port as shown below in Table 1. If the pin of the instance being processed is INPUT, there must be a driver among the instances in the block. Therefore, the direction of the hierarchical port is set to OUTPUT. If, on the other hand, the pin of the instance being processed is OUTPUT, all the instances in the block must be receivers. Therefore, the direction of the hierarchical port is set to INPUT.

TABLE 1

| DIRECTION OF INSTANCE PIN | DIRECTION OF HIERARCHICAL PORT |
|---|---|
| INPUT | OUTPUT |
| OUTPUT | INPUT |
| INOUT | INOUT |

In step S57, the direction of the hierarchical port is changed to INPUT when the direction of the instance pin being processed is OUTPUT (as in the example shown in FIGS. 15A and 15B). In other cases, no change is made (see below Table 2).

TABLE 2

| DIRECTION OF INSTANCE PIN | DIRECTION OF HIERARCHICAL PORT |
|---|---|
| INPUT | NO CHANGE |
| OUTPUT | INPUT |
| INOUT | NO CHANGE |

If the instance pin is OUTPUT, it was a driver and the direction of the hierarchical port was OUTPUT before the instance is moved. Once the driver is moved to the outside of the block, the direction of the hierarchical port is changed to INPUT so as to drive an instance remaining in the block.

In step S55, if there is no net connected to the hierarchical port and a constant is assigned to the hierarchical port, the same constant is assigned to the pin of the copied instance.

In step S57, if there is no net connected to the hierarchical port and a constant is assigned to the hierarchical port, the same constant is assigned to the pin of the copied instance without newly creating a net.

Figure 11A:
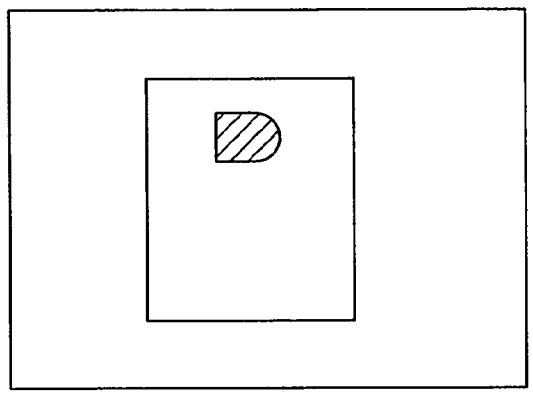
FIGS. 11A and 11B are schematic diagrams illustrating an example of processing for moving an instance to a block one level above.
Figure 11B:
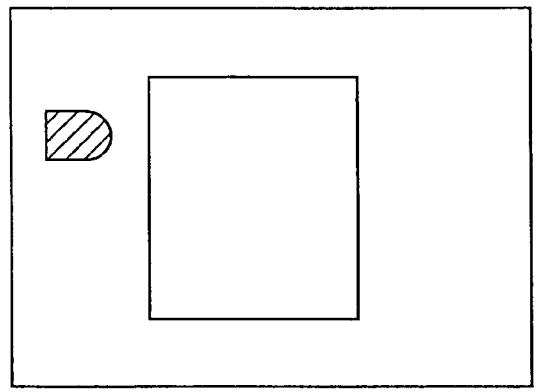
Figure 12A:
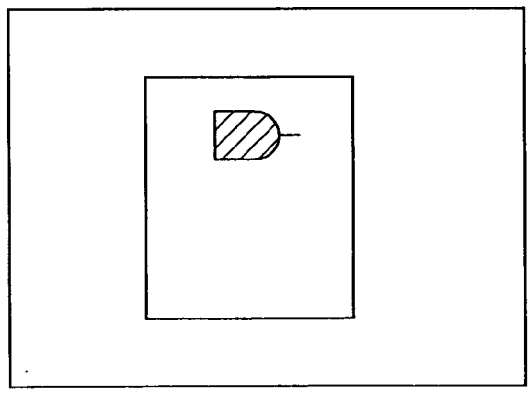
FIGS. 12A and 12B are schematic diagrams illustrating another example of processing for moving an instance to a block one level above.
Figure 12B:
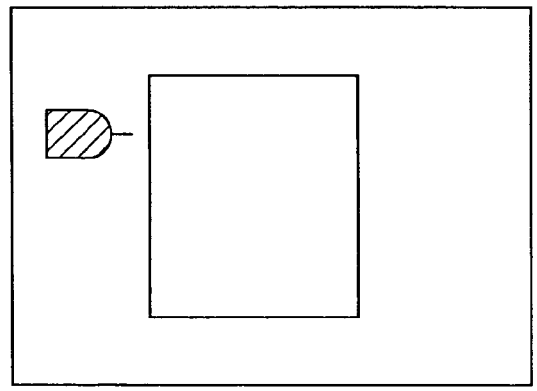

FIGS. 11A and 11B illustrate an example which is determined No in step S43. FIGS. 12A and 12B illustrate an example which is determined Yes in step S47. FIGS. 13A and 13B illustrate an example which is determined Yes in step S50. FIGS. 14A and 14B illustrate an example which is determined Yes in step S54. FIGS. 15A and 15B illustrate an example which is determined No in step S54.

Figure 10A:
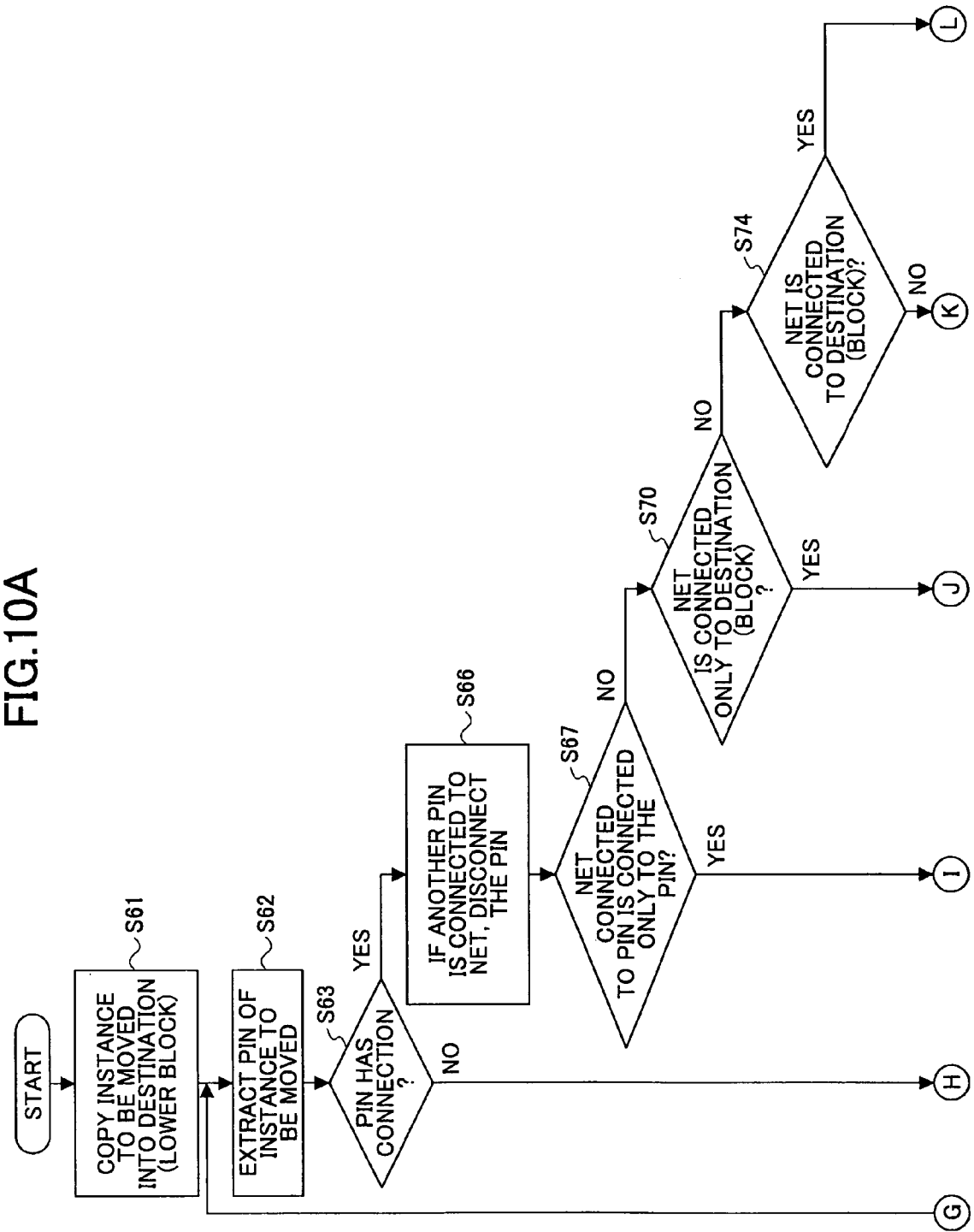
FIG. 10A is a flowchart illustrating processing for moving an instance to a block one level below.
Figure 10B:
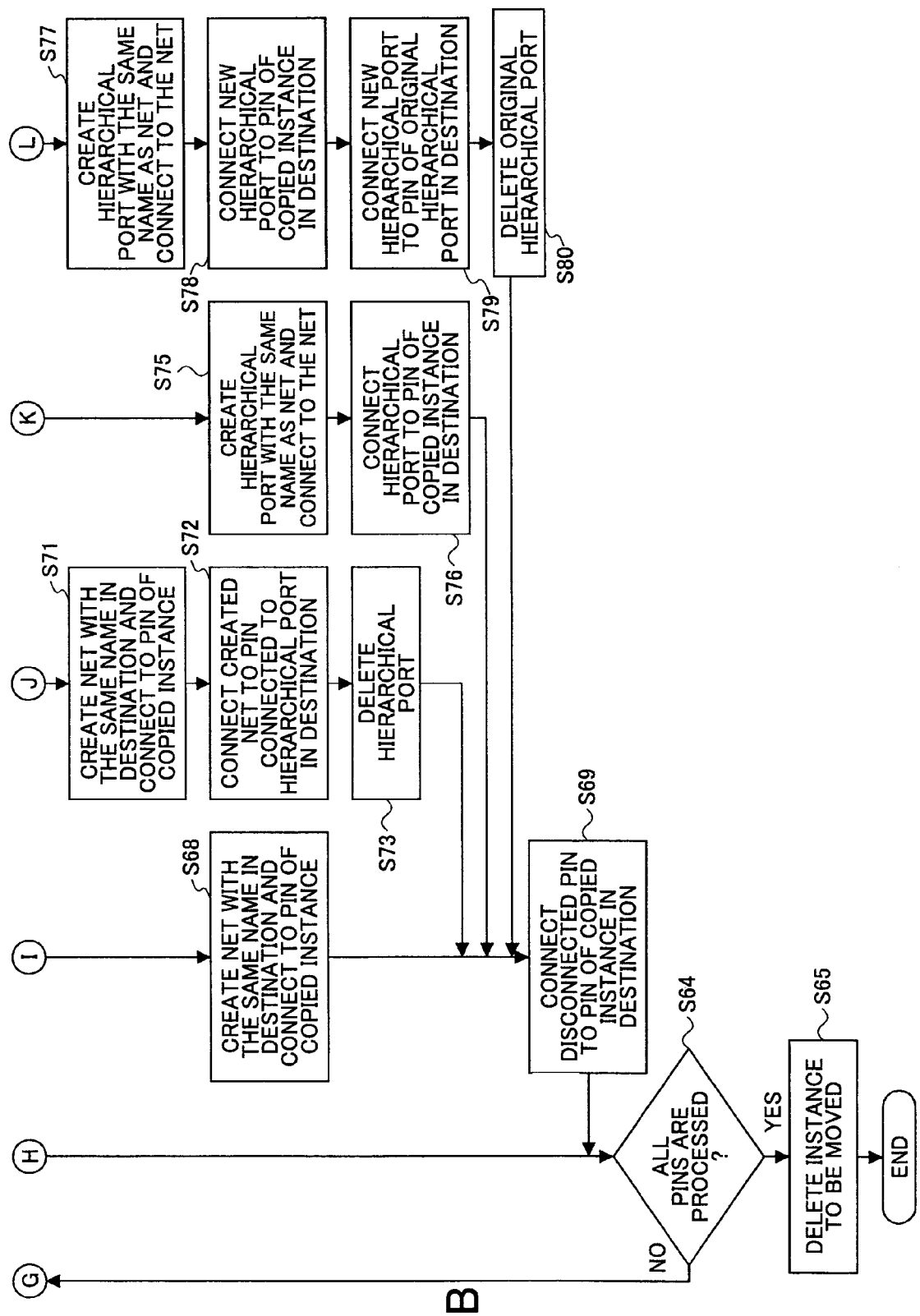
FIG. 10B (continued) is a flowchart illustrating processing for moving an instance to a block one level below.

A flowchart of the processing for moving an instance to a block one level below in step S8 of FIG. 6 is shown in FIGS. 10A and 10B.

Referring to FIGS. 10A and 10B, a copy of an instance to be moved is created in a block one level below (step S61). A pin of the instance to be moved is extracted (step S62), and it is then determined whether the pin has any connection (step S63). If the pin does not have any connection, it is then determined whether all the pins are already processed (step S64). If Yes in step S64, the original instance to be moved is deleted (step S65).

In step S61, if the created instance has the same name as another instance, the instance name is changed to a different name.

If the result of step S63 is Yes, the processing proceeds to step S66. In step S66, if a net connected to the pin of the instance being processed is also connected to another pin of the same instance, the latter pin is disconnected (FIG. 21A→21B).

Figure 17A:
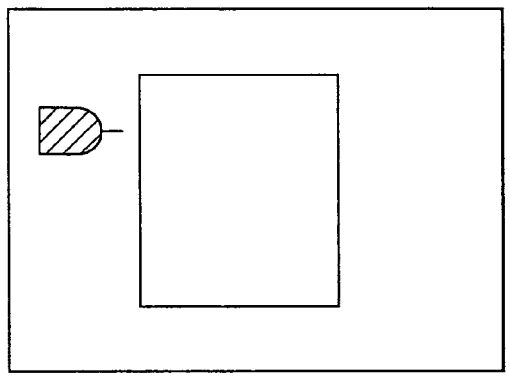
FIGS. 17A and 17B are schematic diagrams illustrating another example of processing for moving an instance to a block one level below.
Figure 17B:
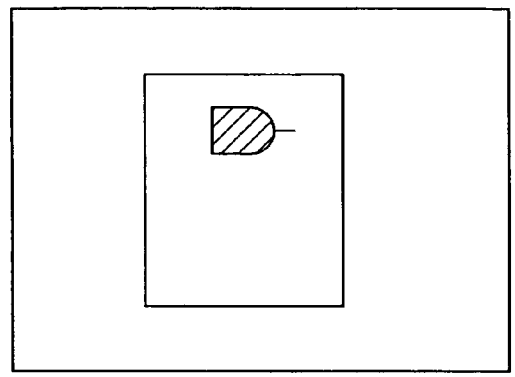

Then, it is determined whether the net connected to the pin is connected only to this pin (step S67). For example, it is determined Yes in an example shown in FIG. 17A. If Yes in step S67, a net with the same name is created in a destination block and then connected to the pin of the copied instance so as to be as shown in FIG. 17B (step S68).

If there is a pin disconnected in step S66, a pin of the copied instance corresponding to the disconnected pin is reconnected to a pin of the copied instance being processed (step S69) (FIG. 21C→21D).

Figure 18A:
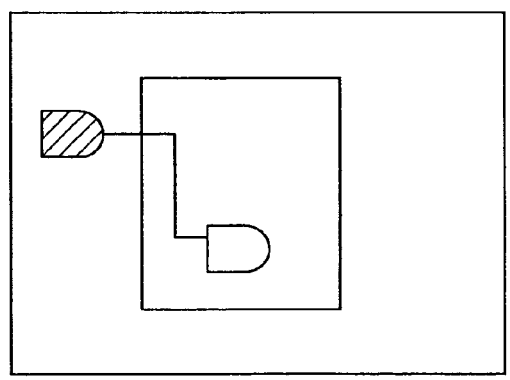
FIGS. 18A and 18B are schematic diagrams illustrating another example of processing for moving an instance to a block one level below.

If No in step S67, it is then determined whether the net is connected only to the destination block (step S70). For example, it is determined Yes in an example shown in FIG. 18A. This is because, as shown in FIG. 18A, an instance (a cell without hatched lines) is connected only to a destination block (a block in the center) and is not connected to other elements.

Figure 18B:
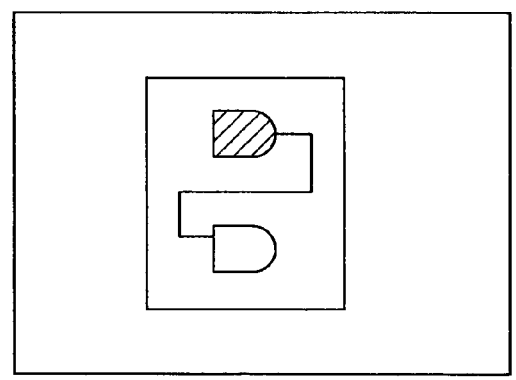

If the result is Yes in step S70, a net having the same name is created in the destination block and then connected to the pin of the copied instance (step S71). In step S72, the net created in the destination block is connected to the pin of the instance (without hatched line in FIGS. 18A and 18B) connected to a hierarchical port of the destination block. Then, the hierarchical port is deleted (step S73) so as to be, for example, as shown in FIG. 18B.

If No in step S70, it is then determined whether the net is connected to the destination block (step S74). For example, it is determined No in an example shown in FIG. 19A. This is because an instance (a cell with hatched lines) to be moved is not connected to a destination block (a block in the center). On the other hand, it is determined Yes in an example shown in FIG. 20A. This is because an instance (a cell with hatched lines) to be moved is connected to a destination block (a block in the center) and also connected to a pin of a cell without hatched lines at the right side shown in the FIG. 18A.

Figure 19A:
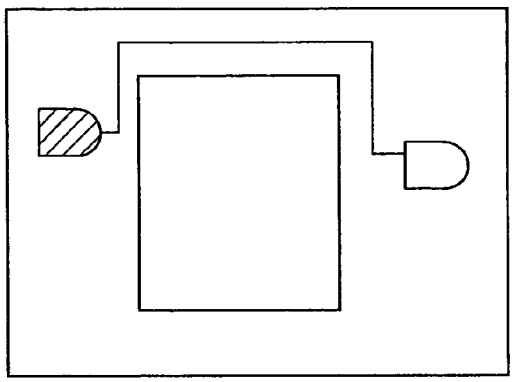
FIGS. 19A and 19B are schematic diagrams illustrating another example of processing for moving an instance to a block one level below.
Figure 19B:
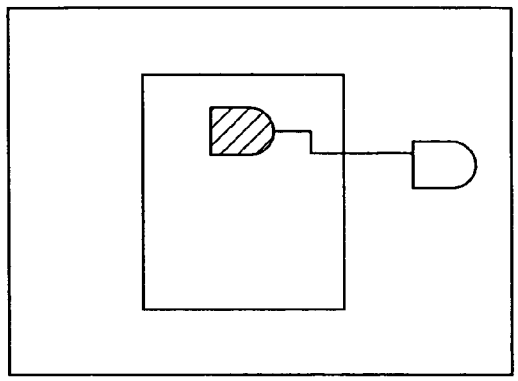

If No in step S74, a hierarchical port having the same name as the net is created and then connected to the net (step S75). In other words, a hierarchical port is newly created in the destination block and then connected to the net being processed. In the destination block, the newly created hierarchical port is connected to a pin of a copied instance in step S76 so as to be as shown in FIG. 19B (step S76).

If Yes in step S74 (as in the example shown in FIG. 20A), a hierarchical port having the same name as the net is created and then connected to the net (step S77). In the destination block, the newly created hierarchical port is connected to a pin of a copied instance (step S78). Then, in the destination block, the newly created hierarchical port is connected to the pin of the instance connected to the original hierarchical port (step S79). The original hierarchical port is then deleted (step S80).

Figure 20A:
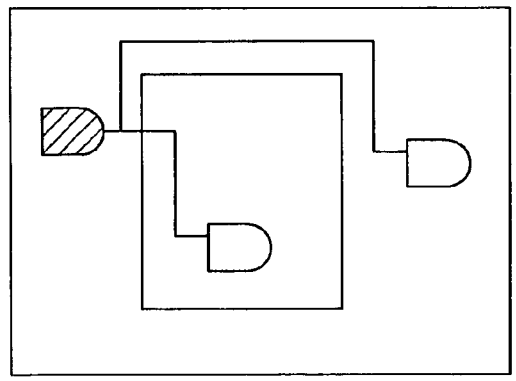
FIGS. 20A and 20B are schematic diagrams illustrating another example of processing for moving an instance to a block one level below.
Figure 20B:
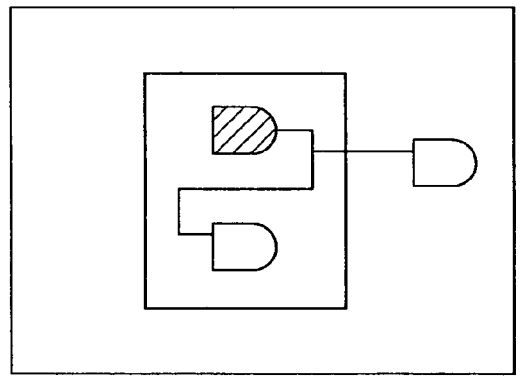

In the example of FIGS. 20A and 20B, a hierarchical port is newly created other than the hierarchical port connected to the destination block (a block in the center in FIGS. 20A and 20B) to which the net is connected. Then, the pin of the copied instance (a cell with hatched lines in FIG. 20B) is connected to the newly created port. After that, the pin of the instance (a cell without hatched lines shown in the center) connected to the original hierarchical port is connected to the newly created port. Then, the original hierarchical port is deleted so as to be as shown in FIG. 20B.

In steps S68 and S71, if the created net has the same name as another net, the name of the created net is changed to a different name. In steps S75 and S77, if the hierarchical port has the same name as another hierarchical port, the name of the created hierarchical port is changed to a different name.

In step S75, a direction the same as the direction of the instance pin being processed is assigned to the newly created hierarchical port. For example, the direction is assigned to the hierarchical port as shown below in Table 3.

TABLE 3

| DIRECTION OF INSTANCE PIN | DIRECTION OF HIERARCHICAL PORT |
|---|---|
| INPUT | INPUT |
| OUTPUT | OUTPUT |
| INOUT | INOUT |

In this case, in which the pin of the instance and the hierarchical port are connected one-to-one, the same direction is assigned.

For determining the direction of the hierarchical port created in step S77, directions of the pins to be connected to the created hierarchical port in steps S78 and S79 are checked. If OUTPUT is included, then the direction of the hierarchical port is set to OUTPUT (e.g. FIG. 20B). If INOUT is included, then the direction of the hierarchical port is set to INOUT. If they are INPUT only, then the direction of the hierarchical port is set to INPUT (this operation is performed in step S80). For example, the direction is assigned to the hierarchical port as shown below in Table 4.

TABLE 4

| DIRECTION OF INSTANCE PIN TO BE CONNECTED TO NEW HIERARCHICAL PORT | DIRECTION OF HIERARCHICAL PORT |
|---|---|
| INC. OUTPUT | OUTPUT |
| INC. INOUT | INOUT |
| INC. ONLY INPUT | INPUT |

In other words, the instance pins in the block to be connected to the hierarchical port are checked. Then, if OUTPUT is included, the hierarchical port is set to OUTPUT because the hierarchical port has no need to be a driver (i.e. no need to drive the cells in the block). On the other hand, if instance pins in the block are INPUT only, the hierarchical port is set to INPUT because the hierarchical port needs to be a driver.

If the pin of the instance has no connection and a constant is assigned to the pin of the instance in step S63, the same constant is assigned to a pin of the copied instance.

Figure 16A:
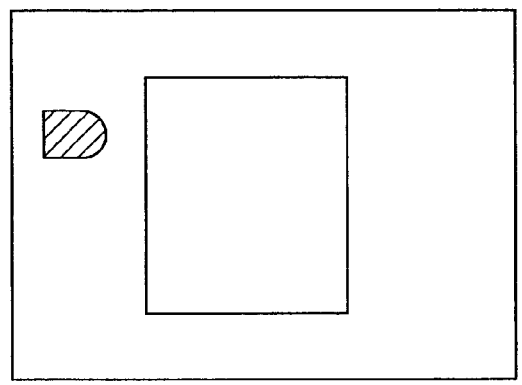
FIGS. 16A and 16B are schematic diagrams illustrating an example of processing for moving an instance to a block one level below.
Figure 16B:
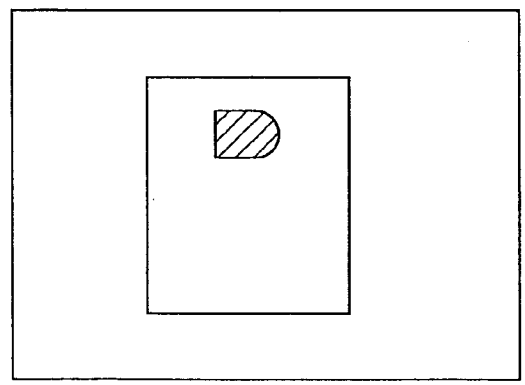

FIGS. 16A and 16B illustrate an example which is determined No in step S63. FIGS. 17A and 17B illustrate an example which is determined Yes in step S67. FIGS. 18A and 18B illustrate an example which is determined Yes in step S70. FIGS. 19A and 19B illustrate an example which is determined No in step S74. FIGS. 20A and 20B illustrate an example which is determined Yes in step S74.

FIGS. 21A-21D illustrate processing in steps S66 and S69.

The following is an example to which a logical hierarchy reconstruction method according the embodiment of the present invention described above with reference to FIGS. 6-10B is applied.

An HDL description of logic circuit design data to be input in this example is shown in FIG. 27. A related library is shown in FIG. 28. A move instruction file is shown in FIG. 29.

The instruction of the move instruction file includes, according to the format described previously, an operation (corresponding to the section (1)) for moving a cell X1 (corresponding to a cell C3 in the block B2 in FIG. 22) below a block X2 to move the block X1 (corresponding to block B1), and an operation (corresponding to the section (2)) for moving a cell X2 (corresponding to a cell C4 in the block B2) below the block X2 to move the block X1 (corresponding to block B1).

First, the HDL reading part 10 shown in FIG. 5A reads the HDL description of the logic circuit design data and stores the logic circuit design data in the logic circuit storage part 82. A logic circuit in this example is the one shown in FIG. 22, which is based on the description shown in FIG. 27.

Then, the move instruction extracting part 60 extracts the move instructions (sources, destinations) from the move instruction file of FIG. 29 and stores the move instructions in the source/destination/common block storage part 83. Thus, the source/destination/common block storage part 83 holds information shown below in Table 5. This information agrees with the instructions in the move instruction file.

TABLE 5

| | SOURCE | DESTINATION | COMMON BLOCK |
|---|---|---|---|
| 1 | /X2/X1 | /X1 | |
| 2 | /X2/X2 | /X1 | |

Then, the multi-instance processing described with reference to FIG. 7 is performed. In this example, because there are instances that need to go through the multi-instance processing, no changes are required in the logic circuit storage part 82. More specifically, in this example, in the hierarchical instances X1 (B1) and X2 (B2) related to the source and destination, the module B1 and the module B2 are referred to only by these instances as shown in lines 9 and 10 in FIG. 27. Accordingly, there is no other hierarchical instance referring to the modules B1 and B2.

Then, the common block finding part 70 performs processing for finding the common block as described above with reference to FIG. 8 and stores the result in the source/destination/common block storage part 83. In this example, the common block of the source block B2 and the destination block B1 is /, i.e., a block TOP in each of the sections (1) and (2) in the instruction (corresponding to Row 1 and Row 2 in Table 5). Although the block TOP is not shown in FIG. 22, the block TOP is provided one level above the blocks B1 and B2 as with the example shown in FIG. 1.

As a result, the information in the source/destination/common block storage part 83 is updated as shown below in Table 6.

TABLE 6

| | SOURCE | DESTINATION | COMMON BLOCK |
|---|---|---|---|
| 1 | /X2/X1 | /X1 | / |
| 2 | /X2/X2 | /X1 | / |

Then, an operation for moving the instance (Row 1 in Table 6) is performed according to the information corresponding to the section (1) stored in the source/destination/common block storage part 83. More specifically, information is acquired from the source/destination/common block storage part 83, so the logic circuit design data stored in the logic circuit storage part 82 is modified.

Figure 23:
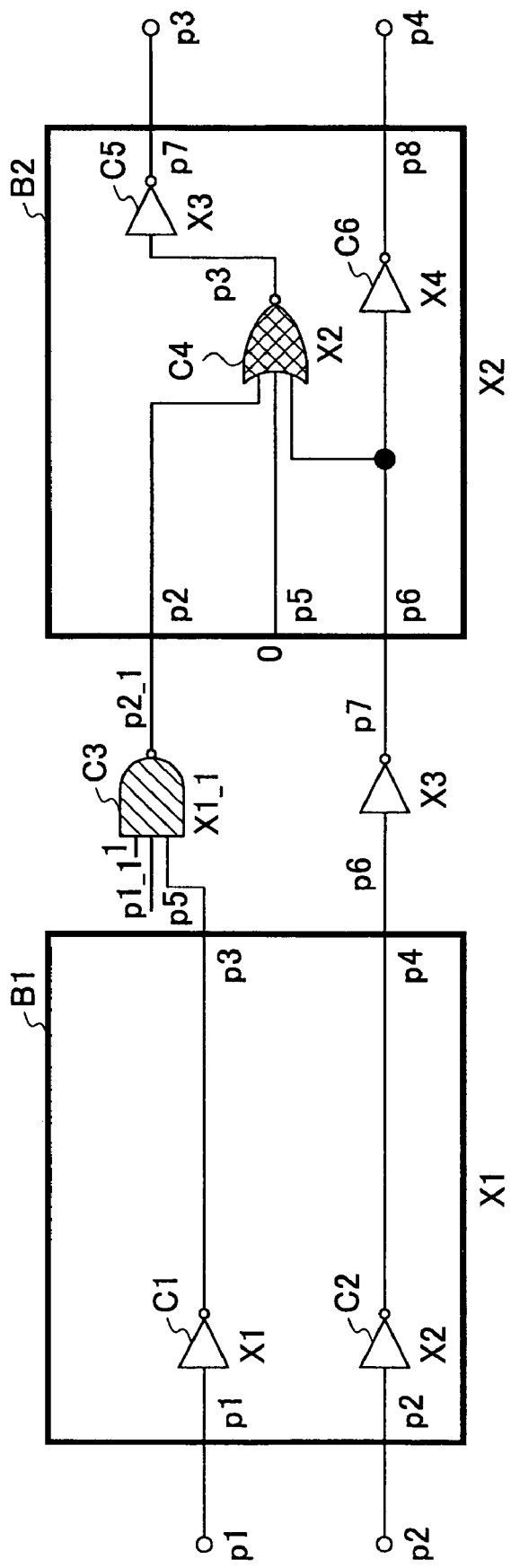

The instance /X2/X1, or the cell C3 in the block B2, is moved to the common block/by the "processing for moving an instance to a block one level above" described above with reference to FIGS. 9A and 9B. Thus, the logic circuit is modified as shown in FIG. 23. As can be seen, the cell C3 is moved leftward from the block B2 so as to be located in the block TOP between the block B1 and the block B2.

Figure 24:
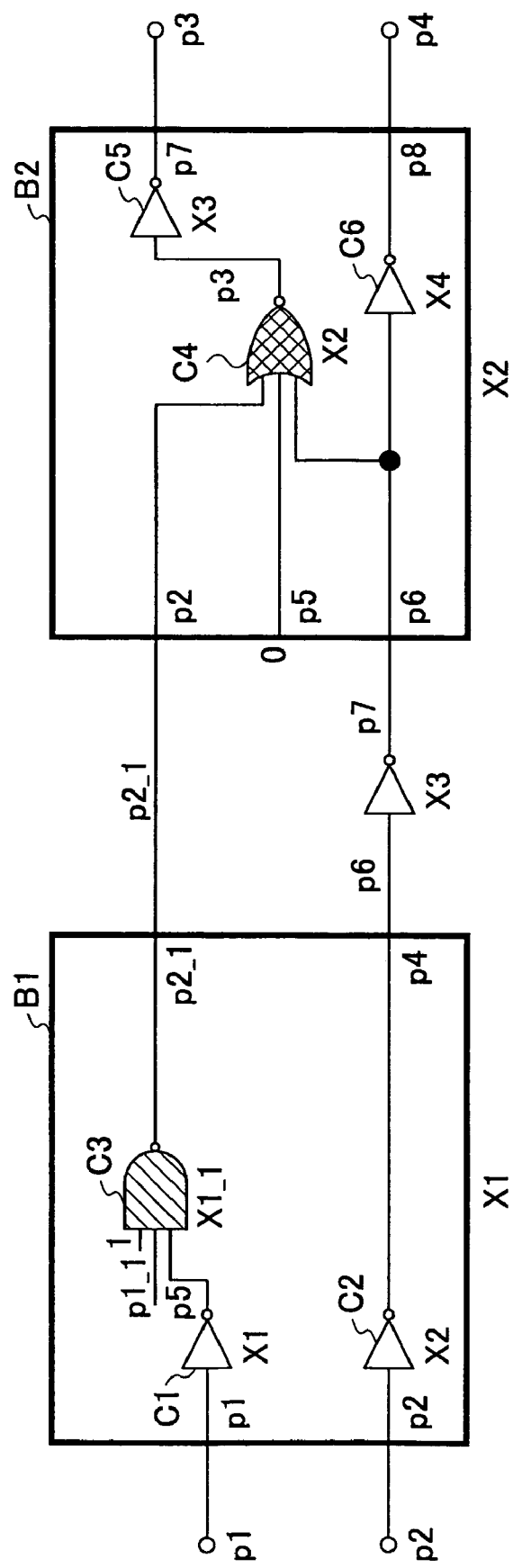

Then, the instance thus moved to the common block/is moved to the destination /X1, or the block B1, by the "processing for moving an instance to a block one level below" described above with reference to FIGS. 10A and 10B. Thus, the logic circuit is modified as shown in FIG. 24. As can be seen, the cell C3 is further moved leftward from the block TOP between the block B1 and the block B2 to be located in the block B1.

Figure 25:
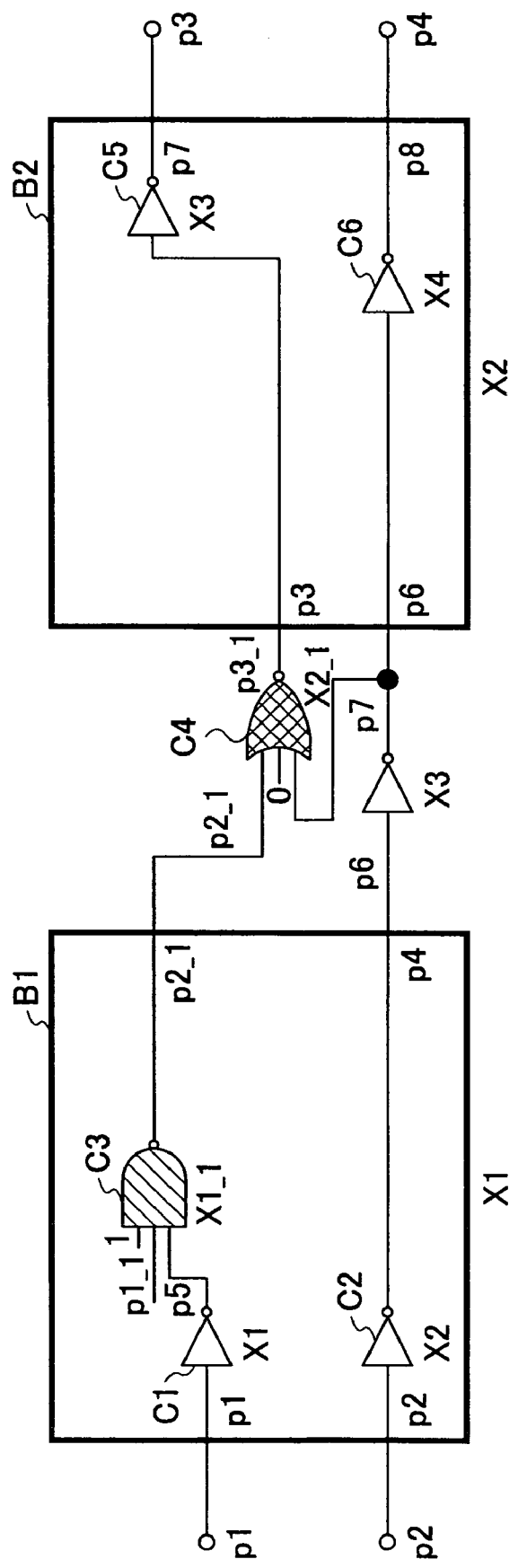

Then, an operation for moving the instance (Row 2 in Table 6) is performed according to the information corresponding to the section (2) stored in the source/destination/common block storage part 83. The instance /X2/X2, or the cell C4 in the block B2, is moved to the common block /, or the block TOP, by the "processing for moving an instance to a block one level above" described above with reference to FIGS. 9A and 9B. Thus, the logic circuit is modified as shown in FIG. 25. As can be seen, the cell C4 is moved leftward from the block B2 to be located in the block TOP between the block B1 and the block B2.

Figure 26:
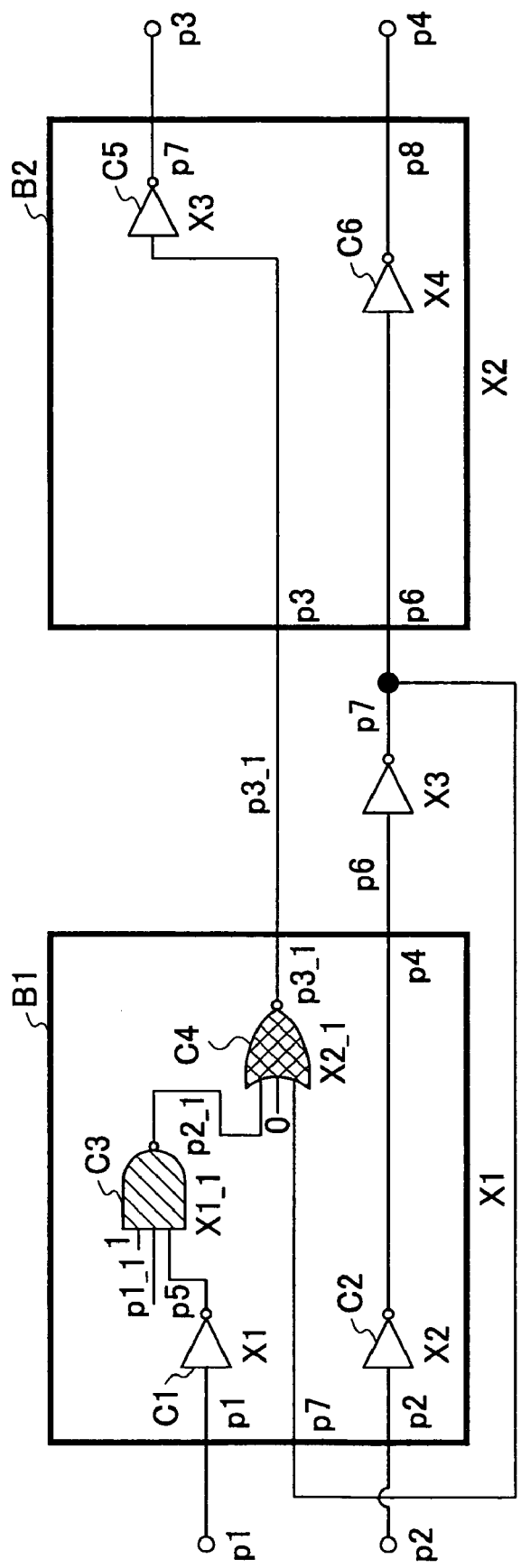

Then, the instance thus moved to the common block/is moved to the destination /X1, or the block B1, by the "processing for moving an instance to a block one level below" described above with reference to FIGS. 10A and 10B. Thus, the logic circuit is modified as shown in FIG. 26. As can be seen, the cell C4 is further moved leftward from the block TOP between the block B1 and the block B2 so as to be located in the block B1.

Finally, the HDL outputting part 20 outputs the logic circuit data having information of the logic circuit reconstructed as shown in FIG. 26 from the logic circuit storage part 82 as an HDL description. The output HDL description is shown in FIG. 30.

Comparing the HDL descriptions in FIGS. 27 and 30, the wires between the block B1 and block B2 are p5, p6 and p7 in line 6 through line 8 in the section (1) in FIG. 27, but they are changed to p6, p7 and p3_1 in FIG. 30. Among these wires, the wires p6 and p7 remain the same. On the other hand, as the cells C3 and C4 moved from the block B2 to the block B1, the wire p3 between the cell C4 and a cell C5 of FIG. 22 is extended between the blocks B1 and B2. The name p3 is changed to p3_1 to avoid double use of the name p3.

Referring to line 9 in the section (1) in FIGS. 27 and 30, the hierarchical ports p1, p2, and p4 of the block B1 (X1) remain the same. On the other hand, a hierarchical port p3 is deleted. This is because the cell C3 shown in FIG. 22 is moved from the block B2 to the block B1, and therefore the hierarchical port p3 of the block B1 (X1) shown in FIG. 22 is deleted (i.e. the transition from FIG. 22 to FIG. 24). A hierarchical port p_1 is created. This is because, as described above, the name of the wire p3 between the cells C4 and C5 shown in FIG. 22 is changed to avoid the double use of the name of the wire p3, and a hierarchical port named p3_1 is created in the block B1 (X1) (i.e. the transition from FIG. 24 to FIG. 26). A hierarchical port p7 is also created. This is because a hierarchical port with the same name as the wire p7 connected to the cell C4 is created in the block B1 (X1) (i.e. the transition from FIG. 25 to FIG. 26).

Referring to line 10 in the section (1) in FIGS. 27 and 30, hierarchical ports p6, p7, and p8 of the block B2 (X2) remain the same. On the other hand, hierarchical ports p4 and p5 are deleted. This is because the cells C3 and C4 shown in FIG. 22 are moved from the block B2 to the block B1, and therefore the hierarchical ports p4 and p5 of the block B2 (X2) shown in FIG. 22 are deleted (i.e. the transition from FIG. 22 to FIG. 25). When the hierarchical port p5, to which the constant 0 is assigned, is deleted, the constant 0 is assigned to a pin B of the cell C4. A hierarchical port p3 is created. This is because a hierarchical port with the same name as the wire p3 between the cell C4 and the cell C5 is created in the block B2 (X2) (i.e. the transition from FIG. 24 to FIG. 25).

Referring to sections (2) and (3) in FIGS. 27 and 30, as the cells C3 and C4 are moved from the block B2 in FIG. 22 to the block B1, a cell X1 (NAND3) and a cell X2 (NOR3) shown in lines 10 and 11 in the section (3) are moved to lines 12 and 13 in the section (2) in FIG. 30 and renamed as X1_1 (NAND3) and X2_1 (NOR3), respectively. This renaming is done to avoid double use of the name by the hierarchical instances X1 and X2 in the block TOP when the cells C3 and C4 are moved to the block TOP.

Some of the wires connected to the moved cells C3 and C4 are renamed. For example, the name of a wire connected to the pin B of the cell X1 shown in line 10 in the section (3) in FIG. 27 is changed from p1 to p1_1. This is because when the logic circuit is modified from the state shown in FIG. 22 to the state shown in FIG. 23, i.e., when the cell C3 is moved to the block TOP, renaming is done to avoid the double use of the wire name p1 which is already given to a wire connected to an input hierarchical port p1 of the block B1.

An input hierarchical port (INPUT) p7 is newly created in line 5 in the section (2) in FIG. 30. This is because the cell C4 is moved from the block B2 to the block B1. With this movement, the wire p6 connected to a pin C of the cell C4 is replaced by the wire p7 in the transition from FIG. 24 to FIG. 25 (a movement to a block one level above). This corresponds to the transition from FIG. 15A to FIG. 15B. That is, the processing in step S57 shown in FIG. 9B is performed.

Further, during the transition to the state shown in FIG. 26 (a movement to a block one level below), a wire p7 connected to an input pin C of the NAND element X2_1, which is moved to the block B1, is newly created. In other words, a transition corresponding to the above described transition from FIG. 19A to 19B (the processing in steps S75 and S76 shown in FIG. 10B) is performed.

It should be understood that the present invention is not limited to the specifically disclosed embodiment, and variations and modifications may be made without departing from the scope of the present invention.

The present application is based on Japanese Priority Application No. 2005-078009 filed on Mar. 17, 2005, with the Japanese Patent Office, the entire contents of which are hereby incorporated by reference.

What is claimed is:

1. A logic circuit design method for use in a logic circuit having a hierarchical structure including an instance, a first block, and a second block, the method comprising the steps of:

reading information about the logic circuit;

moving an instance, which has a signal connection and a first hierarchical port connected to the instance, from a first block to a second block in accordance with the read information;

creating a second hierarchical port in accordance with the movement of the instance;

disconnecting the instance from the first hierarchical port and connecting the instance to the second hierarchical port while maintaining the signal connection to the instance that the instance had at the time when the instance was moved from the first block to the second block; and writing information about the logic circuit including a result of the movement of the instance.

2. The logic circuit design method as claimed in claim 1, further comprising the step of:

assigning a direction to the second hierarchical port when the second hierarchical port is created.

3. The logic circuit design method as claimed in claim 1, further comprising the step of:

if an attribute including a predetermined constant is assigned to a pin of the instance to be moved or to a hierarchical port connected to the pin of the instance, assigning the attribute including the predetermined constant to a pin of the instance after moving the instance.

4. The logic circuit design method as claimed in claim 1, further comprising the step of:

if the instance to be moved includes a plurality of pins connected to a common net, keeping one of the pins connected to the net and disconnecting the other pins from the net before moving the instance, and connecting the one of the pins connected to the net to the other disconnected pins after moving the instance.

5. The logic circuit design method as claimed in claim 1, further comprising the step of:

if a plurality of instances are configured to refer to a common module, creating a copy of the common module such that the instances are configured to separately refer to the original module or the copy of the module.

6. The logic circuit design method as claimed in claim 1, wherein the instance includes at least either one of a block or a cell.

7. A computer-readable recording medium having a logic circuit design program stored therein for use in a logic circuit having a hierarchical structure including an instance, a first block, and a second block, the program comprising computer-executable instructions for:

reading information about the logic circuit;

moving an instance, which has a signal connection and a first hierarchical port connected to the instance, from a first block to a second block in accordance with the read information;

creating a second hierarchical port in accordance with the movement of the instance;

disconnecting the instance from the first hierarchical port and connecting the instance to the second hierarchical port while maintaining the signal connection to the instance that the instance had at the time when the instance was moved from the first block to the second block; and writing information about the logic circuit including a result of the movement of the instance.

8. The computer-readable recording medium having a logic circuit design program stored therein as claimed in claim 7, the program further comprising a computer-executable instruction for:
assigning a direction to the second hierarchical port when the second hierarchical port is created.

9. The computer-readable recording medium having a logic circuit design program stored therein as claimed in claim 7, the program further comprising a computer-executable instruction for:
if an attribute including a predetermined constant is assigned to a pin of the instance to be moved or to a hierarchical port connected to the pin of the instance, assigning the attribute including the predetermined constant to a pin of the instance after moving the instance.

10. The computer-readable recording medium having a logic circuit design program stored therein as claimed in claim 7, the program further comprising a computer-executable instruction for:
if the instance to be moved includes a plurality of pins connected to a common net, keeping one of the pins connected to the net and disconnecting the other pins from the net before moving the instance, and connecting the one of the pins connected to the net to the other disconnected pins after moving the instance.

11. The computer-readable recording medium having a logic circuit design program stored therein as claimed in claim 7, the program further comprising a computer-executable instruction for:
if a plurality of instances are configured to refer to a common module, creating a copy of the common module such that the instances are configured to separately refer to the original module or the copy of the module.

12. The computer-readable recording medium having a logic circuit design program stored therein as claimed in claim 7, wherein the instance includes at least either one of a block or a cell.

13. A logic circuit design device for a logic circuit having a hierarchical structure including an instance, a first block, and a second block, comprising:
a part that reads information about the logic circuit;
a part that moves an instance which has a signal connection and a first hierarchical port connected thereto from a first block to a second block in accordance with the read information;
a part that creates a second hierarchical port in accordance with the movement of the instance, and disconnects the instance from the first hierarchical port and connects the instance to the second hierarchical port while maintaining the signal connection to the instance that the instance had at the time when the instance was moved from the first block to the second block; and
a part that writes information about the logic circuit including a result of the movement of the instance.

14. The logic circuit design device as claimed in claim 13, further comprising:
a part that assigns a direction to the second hierarchical port when the second hierarchical port is created.

15. The logic circuit design device as claimed in claim 13, further comprising:
a part that, if an attribute including a predetermined constant is assigned to a pin of the instance to be moved or to a hierarchical port connected to the pin of the instance, assigns the attribute including the predetermined constant to a pin of the instance after moving the instance.

16. The logic circuit design device as claimed in claim 13, further comprising:
a part that, if the instance to be moved includes a plurality of pins connected to a common net, keeps one of the pins connected to the net and disconnects the other pins from the net before moving the instance, and connects the one of the pins connected to the net to the other disconnected pins after moving the instance.

17. The logic circuit design device as claimed in claim 13, further comprising:
a part that, if a plurality of instances are configured to refer to a common module, creates a copy of the common module such that the instances are configured to separately refer to the original module or the copy of the module.

18. The logic circuit design device as claimed in claim 13, wherein the instance includes at least either one of a block or a cell.

* * * * *